US012142213B2

(12) United States Patent
An et al.

(10) Patent No.: US 12,142,213 B2
(45) Date of Patent: Nov. 12, 2024

(54) DISPLAY DEVICE

(71) Applicant: Samsung Display Co., LTD., Yongin-si (KR)

(72) Inventors: Jinsung An, Gwacheon-si (KR); Youngtaek Oh, Yongin-si (KR); Sungho Kim, Yeongtong-gu (KR); Yongjae Kim, Seoul (KR); Sugwoo Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/175,412

(22) Filed: Feb. 27, 2023

(65) Prior Publication Data

US 2024/0021157 A1 Jan. 18, 2024

(30) Foreign Application Priority Data

Jul. 12, 2022 (KR) ......................... 10-2022-0085540

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ......... G09G 3/3233; G09G 2300/0819; G09G 2300/0842; G09G 2300/0861;
(Continued)

(56) References Cited

U.S. PATENT DOCUMENTS

| | | | |
|---|---|---|---|
| 8,711,138 B2 | 4/2014 | Kawabe | |
| 2021/0280130 A1* | 9/2021 | Wang | G09G 3/3233 |
| 2023/0207572 A1* | 6/2023 | Ma | H01L 27/124 |
| | | | 257/72 |

FOREIGN PATENT DOCUMENTS

| | | |
|---|---|---|
| KR | 10-2020-0088953 A | 7/2020 |
| KR | 10-2021-0013509 A | 2/2021 |

(Continued)

*Primary Examiner* — Lixi C Simpson
(74) *Attorney, Agent, or Firm* — Lewis Roca Rothgerber Christie LLP

(57) ABSTRACT

A display device includes: a light emitting diode; a driving transistor configured to transmit driving current to the light emitting diode; a bias transistor including an input terminal electrically connected to a bias voltage line; a first light emission control transistor including an output terminal electrically connected to an in put terminal of the driving transistor, and a gate electrode configured to receive a light emission control signal; a second light emission control transistor including an input terminal electrically connected to an output terminal of the driving transistor, and a gate electrode configured to receive the light emission control signal; a bias bridge electrode electrically in contact with each of an output terminal of the bias transistor and the input terminal of the driving transistor; and a first light emission control bridge electrode configured to receive the light emission control signal.

25 Claims, 28 Drawing Sheets

(51) Int. Cl.
*H10K 59/124* (2023.01)
*H10K 59/131* (2023.01)
(52) U.S. Cl.
CPC ......... *H10K 59/124* (2023.02); *H10K 59/131* (2023.02); *G09G 2300/0819* (2013.01); *G09G 2300/0842* (2013.01); *G09G 2300/0861* (2013.01)
(58) Field of Classification Search
CPC ............. H10K 59/131; H10K 59/1213; H10K 59/124; H10K 59/1216
See application file for complete search history.

(56) References Cited

FOREIGN PATENT DOCUMENTS

| | | | |
|---|---|---|---|
| KR | 10-2021-0111945 A | 9/2021 | |
| WO | WO-2022109984 A1 * | 6/2022 | ........... G09G 3/3258 |

\* cited by examiner

VBIAS:VBIAS(N),VBIAS(N+1)

DISPLAY DEVICE

CROSS-REFERENCE TO RELATED APPLICATION

The present application claims priority to and the benefit of Korean Patent Application No. 10-2022-0085540 filed on Jul. 12, 2022 in the Korean Intellectual Property Office (KIPO), the entire disclosure of which is incorporated herein by reference.

BACKGROUND

1. Field

Aspects of some embodiments of the present disclosure relate to a display device.

2. Description of the Related Art

Electronic apparatuses such as smartphones, computers and tablet PCs may include a display device. Recently, the need for technology of reducing power consumption of a display device is increasing in order to minimize or reduce battery consumption of electronic apparatuses. Accordingly, low-frequency driving schemes for driving a display device at a relatively low frequency have been studied.

When a display device is driven at a relatively low frequency (for example, when a duration of one frame becomes relatively longer), leakage current in a pixel circuit may be increased. Accordingly, differences in luminance of pixels may occur between successive frames, and a defect may be recognized in an image displayed on the display device.

The above information disclosed in this Background section is only for enhancement of understanding of the background and therefore the information discussed in this Background section does not necessarily constitute prior art.

SUMMARY

Aspects of some embodiments of the present disclosure include a display device having relatively improved low frequency characteristics.

However, the characteristics of embodiments according to the present disclosure are not limited to the above-described object, and may be variously expanded without departing from the idea and scope of embodiments according to the present disclosure.

According to some embodiments, a display device includes: a light emitting diode; a driving transistor for transmitting driving current to the light emitting diode; a bias transistor including an input terminal electrically connected to a bias voltage line; a first light emission control transistor including an output terminal electrically connected to an input terminal of the driving transistor, and a gate electrode to which a light emission control signal is applied; a second light emission control transistor including an input terminal electrically connected to an output terminal of the driving transistor, and a gate electrode to which the light emission control signal is applied; a bias bridge electrode electrically coming into contact with each of an output terminal of the bias transistor and the input terminal of the driving transistor; and a first light emission control bridge electrode applied thereto with the light emission control signal, defining the gate electrode of the first light emission control transistor and the gate electrode of the second light emission control transistor, and spaced apart from the bias bridge electrode when viewed in a plan view.

According to some embodiments, the display device may further include: a second light emission control bridge electrode on the first light emission control bridge electrode when viewed in a sectional view, and electrically coming into contact with the first light emission control bridge electrode; and an light emission control line on the second light emission control bridge electrode when viewed in the sectional view, electrically coming into contact with the second light emission control bridge electrode, and applied thereto with the light emission control signal.

According to some embodiments, the display device may further include at least one inorganic insulating layer between the second light emission control bridge electrode and the first light emission control bridge electrode when viewed in the sectional view.

According to some embodiments, the display device may further include at least one organic insulating layer between the light emission control line and the second light emission control bridge electrode when viewed in the sectional view.

According to some embodiments, a distance between a bottom surface of the light emission control line and a top surface of the second light emission control bridge electrode when viewed in the sectional view may be greater than a distance between a bottom surface of the second light emission control bridge electrode and a top surface of the first light emission control bridge electrode when viewed in a sectional view.

According to some embodiments, the light second emission control bridge electrode may be spaced apart from the bias bridge electrode when viewed in a plan view.

According to some embodiments, the light second emission control bridge electrode may be on the same layer as the bias bridge electrode.

According to some embodiments, the display device may further include a diode transistor including a first sub-transistor having an output terminal connected to the gate electrode of the driving transistor, and a second sub-transistor having an output terminal connected to an input terminal of the first sub-transistor and an input terminal connected to the output terminal of the driving transistor.

According to some embodiments, the display device may further include a first stabilization electrode overlapping with a first common area of a semiconductor layer defining each of the input terminal of the first sub-transistor and the output terminal of the second sub-transistor, thereby defining a first stabilization capacitor.

According to some embodiments, the display device may further include a first bottom metal electrode overlapping with the first common area of the semiconductor layer defining each of the input terminal of the first sub-transistor and the output terminal of the second sub-transistor, thereby defining an additional-stabilization capacitor.

According to some embodiments, the first stabilization electrode may be above the first common area of the semiconductor layer when viewed in the sectional view, and the first bottom metal electrode may be below the first common area of the semiconductor layer when viewed in the sectional view.

According to some embodiments, the first stabilization electrode and the first bottom metal electrode may be electrically connected to each other, and the same signal may be applied to the first stabilization electrode and the first bottom metal electrode.

According to some embodiments, the signal applied to the first stabilization electrode and the first bottom metal electrode may be a constant voltage signal.

According to some embodiments, each of the first sub-transistor and the second sub-transistor may be a double-gate transistor including a top gate electrode and a bottom gate electrode.

According to some embodiments, the display device may further include a first gate voltage line defining a top gate electrode of the first sub-transistor and a top gate electrode of the second sub-transistor; and a second bottom metal electrode defining a bottom gate electrode of the first sub-transistor and a bottom gate electrode of the second sub-transistor.

According to some embodiments, the first gate voltage line and the second bottom metal electrode may be electrically connected to each other, and a first gate voltage provided by the first gate voltage line may be applied to the second bottom metal electrode.

According to some embodiments, the display device may further include a driving initialization transistor including a third sub-transistor having an output terminal connected to the gate electrode of the driving transistor, and a fourth sub-transistor having an output terminal connected to an input terminal of the third sub-transistor and an input terminal connected to an initialization voltage line.

According to some embodiments, the bias voltage line may overlap with a second common area of a semiconductor layer defining each of the input terminal of the third sub-transistor and the output terminal of the fourth sub-transistor, thereby defining the second stabilization capacitor.

According to some embodiments of the present disclosure, the display device includes: a light emitting diode; a driving transistor for transmitting driving current to the light emitting diode; a bias transistor including an input terminal electrically connected to a bias voltage line; a first light emission control transistor including an output terminal electrically connected to an input terminal of the driving transistor, and a gate electrode to which a light emission control signal is applied; a second light emission control transistor including an input terminal electrically connected to an output terminal of the driving transistor, and a gate electrode to which the light emission control signal is applied; a diode transistor including a first sub-transistor having an output terminal connected to a gate electrode of the driving transistor, and a second sub-transistor having an output terminal connected to an input terminal of the first sub-transistor and an input terminal connected to the output terminal of the driving transistor; and a first bottom metal electrode overlapping with a first common area of a semiconductor layer defining each of the input terminal of the first sub-transistor and the output terminal of the second sub-transistor, thereby defining an additional-stabilization capacitor.

According to some embodiments, the display device may further include a first stabilization electrode overlapping with the first common area of the semiconductor layer defining each of the input terminal of the first sub-transistor and the output terminal of the second sub-transistor, thereby defining a first stabilization capacitor.

According to some embodiments, each of the first sub-transistor and the second sub-transistor may be a double-gate transistor including a top gate electrode and a bottom gate electrode.

According to some embodiments, the display device may further include a first gate voltage line defining a top gate electrode of the first sub-transistor and a bottom gate electrode of the second sub-transistor; and a second bottom metal electrode defining a bottom gate electrode of the first sub-transistor and a bottom gate electrode of the second sub-transistor, and electrically connected to the first gate voltage line.

According to some embodiments, the first bottom metal electrode and the second bottom metal electrode may be on the same layer.

According to some embodiments, each of the first bottom metal electrode and the second bottom metal electrode may be below the semiconductor layer when viewed in the sectional view, and the first bottom metal electrode and the second bottom metal electrode may be spaced apart from each other when viewed in the plan view.

According to some embodiments of the present disclosure, the display device includes: a light emitting diode; a driving transistor for transmitting driving current to the light emitting diode; a bias transistor including an input terminal electrically connected to a bias voltage line; a first light emission control transistor including an output terminal electrically connected to an input terminal of the driving transistor, and a gate electrode to which a light emission control signal is applied; a second light emission control transistor including an input terminal electrically connected to an output terminal of the driving transistor, and a gate electrode to which the light emission control signal is applied; a diode transistor including a first sub-transistor having an output terminal connected to a gate electrode of the driving transistor, and a second sub-transistor having an output terminal connected to an input terminal of the first sub-transistor and an input terminal connected to the output terminal of the driving transistor; a first gate voltage line defining a top gate electrode of the first sub-transistor and a top gate electrode of the second sub-transistor; and a second bottom metal electrode defining a bottom gate electrode of the first sub-transistor and a bottom gate electrode of the second sub-transistor.

According to some embodiments, the display device includes: a bias bridge electrode electrically coming into contact with each of an output terminal of the bias transistor and the input terminal of the driving transistor; and a first light emission control bridge electrode applied thereto with the light emission control signal and spaced apart from the bias bridge electrode when viewed in the plan view. According to the present disclosure, the first light emission control bridge electrode is spaced apart from the bias bridge electrode when viewed in the plan view, so that instances of signal interference occurring between the signal applied to the first light emission control bridge electrode and the signal applied to the bias bridge electrode may be prevented or reduced.

According to some embodiments, the display device includes: a diode transistor including a first sub-transistor having an output terminal connected to a gate electrode of the driving transistor, and a second sub-transistor having an output terminal connected to an input terminal of the first sub-transistor and an input terminal connected to the output terminal of the driving transistor; and a first bottom metal electrode overlapping with a first common area of a semiconductor layer defining each of the input terminal of the first sub-transistor and the output terminal of the second sub-transistor, thereby defining an additional-stabilization capacitor. Accordingly, the voltage level can be maintained relatively constantly at each of the input terminal of the first sub-transistor and the output terminal of the second sub-transistor.

According to some embodiments, the display device includes: a diode transistor including a first sub-transistor having an output terminal connected to a gate electrode of the driving transistor, and a second sub-transistor having an output terminal connected to an input terminal of the first sub-transistor and an input terminal connected to the output terminal of the driving transistor; a first gate voltage line defining a top gate electrode of the first sub-transistor and a top gate electrode of the second sub-transistor; and a second bottom metal electrode defining a bottom gate electrode of the first sub-transistor and a bottom gate electrode of the second sub-transistor. Accordingly, each of the first sub-transistor and the second sub-transistor can have a double-gate structure, and diode characteristics of the first sub-transistor and the second sub-transistor can be improved.

However, the characteristics of embodiments according to the present disclosure are not limited to the above-described characteristics, and may be variously expanded without departing from the idea and scope of embodiments according to the present disclosure.

DETAILED DESCRIPTION

Figure 1:
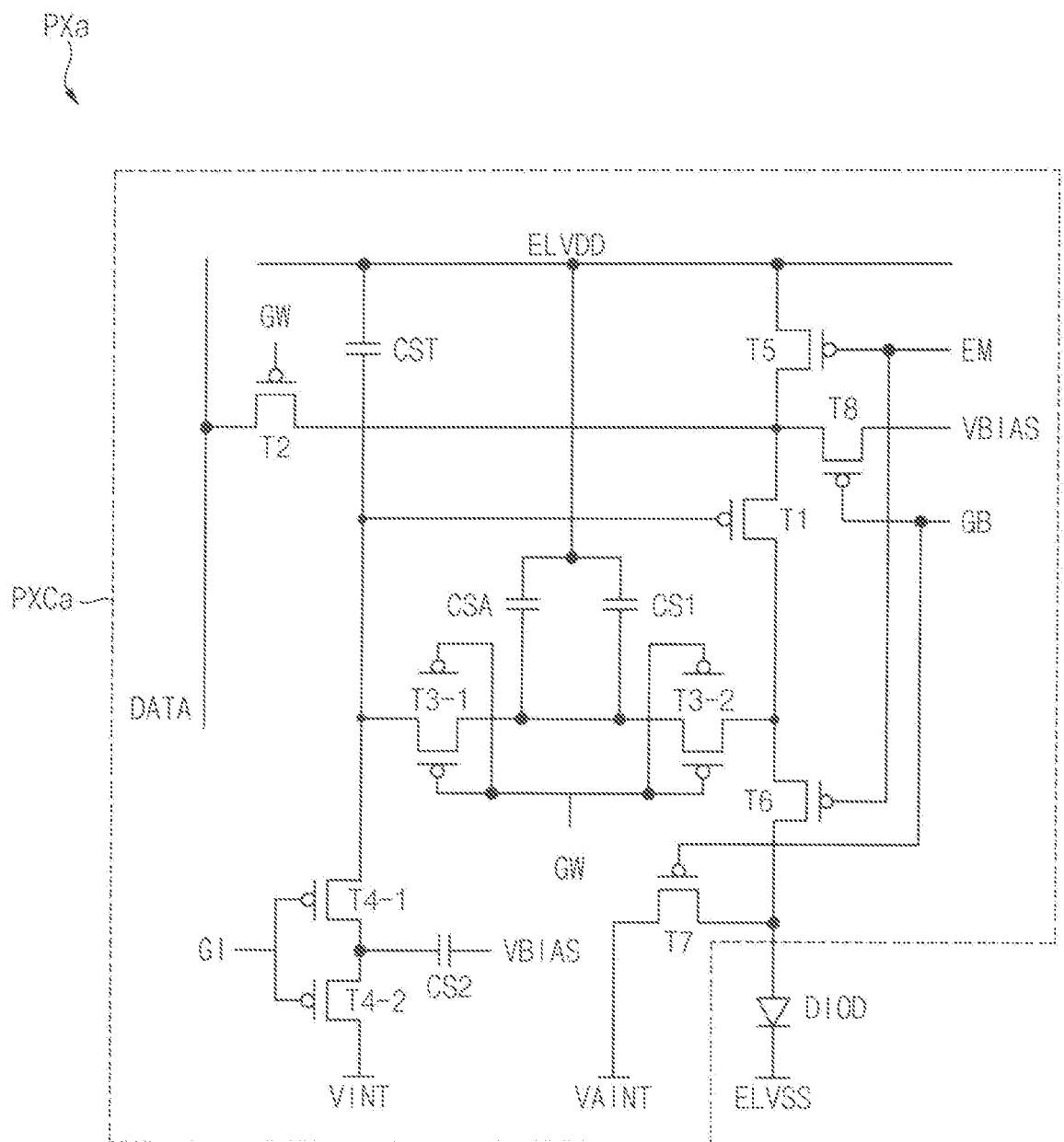
FIG. 1 is a circuit diagram for explaining a pixel included in a display device according to some embodiments of the present disclosure.

Hereinafter, a display device according to some embodiments of the present disclosure will be described in more detail with reference to the accompanying drawings. The same or similar reference numerals are used for the same components in the accompanying drawings.

FIG. 1 is a circuit diagram for explaining a pixel included in a display device according to some embodiments of the present disclosure.

Referring to FIG. 1, the display device according to some embodiments of the present disclosure may include a pixel PXa. The pixel PXa may be defined in a minimum unit for emitting light, and may include a pixel circuit PXCa and a light emitting diode DIOD.

The pixel circuit PXCa may include at least one transistor and at least one capacitor. The light emitting diode DIOD may be electrically connected to the pixel circuit PXCa, and may include any configuration (for example, an organic light emitting diode and the like) capable of emitting light based on a signal provided by the pixel circuit PXCa.

The pixel circuit PXCa may include a driving transistor T1, at least one switching transistor and a storage capacitor CST. For example, the pixel circuit PXCa may include a driving transistor T1, a switching transistor T2 for providing a data voltage to the driving transistor T1, a first light emission control transistor T5 connected between a first power voltage line ELVDD and the driving transistor T1, a second light emitting control transistor T6 connected between the driving transistor T1 and the light emitting diode DIOD, a bias transistor T8 connected to each of the driving transistor T1 and the first light emission control transistor T5 and a storage Capacitor CST.

Selectively, the pixel circuit PXCa may further include at least one other switching transistor. For example, the pixel circuit PXCa may further include at least one of a diode transistor T3, a driving initialization transistor T4, or a diode initialization transistor T7.

In addition, selectively, the pixel circuit PXCa may further include at least one other capacitor. For example, the pixel circuit PXCa may further include at least one of a first stabilization capacitor CS1, a second stabilization capacitor CS2, or an additional-stabilization capacitor CSA.

Hereinafter, the transistors T1, T2, T3, T4, T5, T6, T7, and T8, and the capacitors CST, CS1, CS2, and CSA described above will be described in more detail.

An input terminal of the driving transistor T1 may be connected to a data voltage line DATA, and an output terminal of the driving transistor T1 may be connected to the light emitting diode DIOD.

The driving transistor T1 may receive the data voltage from the data voltage line DATA, and generate driving current corresponding to the data voltage. The driving current may be provided to the light emitting diode DIOD.

An input terminal of the switching transistor T2 may be connected to the data voltage line DATA, an output terminal of the switching transistor T2 may be connected to the input terminal of the driving transistor T1, and a gate electrode of the switching transistor T2 may be connected to a first gate voltage line GW.

Accordingly, the switching transistor T2 may be turned on by a first gate voltage provided by the first gate voltage line GW. During the period in which the switching transistor T2 is turned on, the switching transistor T2 may provide the data voltage to the driving transistor T1.

The diode transistor T3 may include a first sub-transistor T3-1 and a second sub-transistor T3-2 connected to each other. An input terminal of the first sub-transistor T3-1 may be connected to an output terminal of the second sub-transistor T3-2, an output terminal of the first sub-transistor T3-1 may be connected to a gate electrode of the driving transistor T1, and an input terminal of the second sub-transistor T3-2 may be connected to the output terminal of the driving transistor T1. Each of the gate electrode of the first sub-transistor T3-1 and the gate electrode of the second sub-transistor T3-2 may be connected to the first gate voltage line GW.

Accordingly, the diode transistor T3 may be turned on by the first gate voltage provided by the first gate voltage line GW. During the period in which the diode transistor T3 is turned on, the diode transistor T3 may compensate a threshold voltage of the driving transistor T1 by diode-connecting the driving transistor T1.

According to some embodiments, as shown in FIG. 1, each of the first sub-transistor T3-1 and the second sub-transistor T3-2 may be a double-gate transistor including a top gate electrode and a bottom gate electrode. The top gate electrode and the bottom gate electrode included in each of the first sub-transistor T3-1 and the second sub-transistor T3-2 may be connected to the first gate voltage line GW.

The driving initialization transistor T4 may include a third sub-transistor T4-1 and a fourth sub-transistor T4-2 connected to each other. An input terminal of the third sub-transistor T4-1 may be connected to an output terminal of the fourth sub-transistor T4-2, an output terminal of the third sub-transistor T4-1 may be connected to the gate electrode of the driving transistor T1, and an input terminal of the fourth sub-transistor T4-2 may be connected to an initialization voltage line VINT. Each of the gate electrode of the third sub-transistor T4-1 and the gate electrode of the fourth sub-transistor T4-2 may be connected to a second gate voltage line GI.

Accordingly, the driving initialization transistor T4 may be turned on by a second gate voltage provided by the second gate voltage line GI. During the period in which the driving initialization transistor T4 is turned on, the driving initialization transistor T4 may provide an initialization voltage provided by the initialization voltage line VINT to the gate electrode of the driving transistor T1.

An input terminal of the first light emission control transistor T5 may be connected to the first power voltage line ELVDD, an output terminal of the first light emission control transistor T5 may be connected to the input terminal of the driving transistor T1, and a gate electrode of the first light emission control transistor T5 may be connected to a light emission control line EM.

Accordingly, the first light emission control transistor T5 may be turned on by a light emission control signal provided by the light emission control line EM. During the period in which the first light emission control transistor T5 is turned on, the first light emission control transistor T5 may provide a first power voltage provided by the first power voltage line ELVDD to the driving transistor T1.

According to some embodiments, each of the first power voltage provided by the first power voltage line ELVDD and a second power supply voltage provided by a second power voltage line ELVSS connected to the light emitting diode DIOD may be a constant voltage. The first power voltage and the second power voltage may have levels with voltages different from each other.

An input terminal of the second light emission control transistor T6 may be connected to the output terminal of the driving transistor T1, an output terminal of the second light emission control transistor T6 may be connected to the light emitting diode DIOD, and a gate electrode of the second light emission control transistor T6 may be connected to the light emission control line EM.

Accordingly, the second light emission control transistor T6 may be turned on by the light emission control signal. During the period in which the second light emission control transistor T6 is turned on, the second light emission control transistor T6 may provide the driving current to the light emitting diode DIOD.

An input terminal of the diode initialization transistor T7 may be connected to a diode initialization voltage line VAINT, an output terminal of the diode initialization transistor T7 may be connected to the light emitting diode DIOD, and a gate electrode of the diode initialization transistor T7 may be connected to a third gate voltage line GB.

Accordingly, the diode initialization transistor T7 may be turned on by a third gate voltage provided by the third gate voltage line GB. During the period in which the diode initialization transistor T7 is turned on, the diode initialization transistor T7 may provide a diode initialization voltage provided by the diode initialization voltage line VAINT to the light emitting diode DIOD.

An input terminal of the bias transistor T8 may be connected to a bias voltage line VBIAS, an output terminal of the bias transistor T8 may be connected to the input terminal of the driving transistor T1, and a gate electrode of the bias transistor T8 may be connected to the third gate voltage line GB.

Accordingly, the bias transistor T8 may be turned on by the third gate voltage. During the period in which the bias transistor T8 is turned on, the bias transistor T8 may provide a bias voltage to the driving transistor T1.

A first terminal of the storage capacitor CST may be connected to the gate electrode of the driving transistor T1, and a second terminal of the storage capacitor CST may be connected to the first power voltage line ELVDD.

During the inactivation period of the first gate voltage provided by the first gate voltage line GW, the storage capacitor CST may allow a voltage level of the gate electrode of the driving transistor T1 to be maintained.

A first terminal of the first stabilization capacitor CS1 may be connected to each of the input terminal of the first sub-transistor T3-1 and the output terminal of the second sub-transistor T3-2, and a second terminal of the first stabilization capacitor CS1 may be connected to the first power voltage line ELVDD.

The first stabilization capacitor CS1 may relatively constantly maintain the voltage level at each of the input terminal of the first sub-transistor T3-1 and the output terminals of the second sub-transistor T3-2. Accordingly, leakage current in the diode transistor T3 may be reduced, and low-frequency characteristics of the display device may be improved.

A first terminal of the second stabilization capacitor CS2 may be connected to each of the input terminal of the third sub-transistor T4-1 and the output terminal of the fourth sub-transistor T4-2, and a second terminal of the second stabilization capacitor CS2 may be connected to the bias voltage line VBIAS.

The second stabilization capacitor CS2 may relatively constantly maintain the voltage level at each of the input terminal of the third sub-transistor T4-1 and the output terminal of the fourth sub-transistor T4-2. Accordingly, leakage current of the driving initialization transistor T4 may be reduced, and low-frequency characteristics of the display device may be improved.

A first terminal of the additional-stabilization capacitor CSA may be connected to each of the input terminal of the first sub-transistor T3-1 and the output terminal of the second sub-transistor T3-2, and a second terminal of the additional-stabilization capacitor CSA may be connected to the first power voltage line ELVDD.

The additional-stabilization capacitor CSA may perform substantially the same function as the first stabilization capacitor CS1. Specifically, the additional-stabilization capacitor CSA may relatively constantly maintain the voltage level at each of the input terminal of the first sub-transistor T3-1 and the output terminal of the second sub-transistor T3-2.

According to some embodiments, as shown in FIG. 1, when the pixel circuit PXa simultaneously includes the first stabilization capacitor CS1 and the additional-stabilization capacitor CSA, the leakage current in the diode transistor T3 may be further reduced, and the low-frequency characteristics of the display device may be further improved.

FIGS. 2 to 20 are views for explaining the pixel of FIG. 1. FIGS. 2 to 20 are views for explaining a plurality of pixel circuits located adjacent to each other in a part of a display area for displaying images, in the display device according to some embodiments of the present disclosure. The pixel circuits may include configurations substantially identical to each other. Accordingly, for convenience of description, only the configuration corresponding to one of the pixel circuits (for example, PXCa in FIG. 1) will be described in FIGS. 2 to 20.

Figure 2:
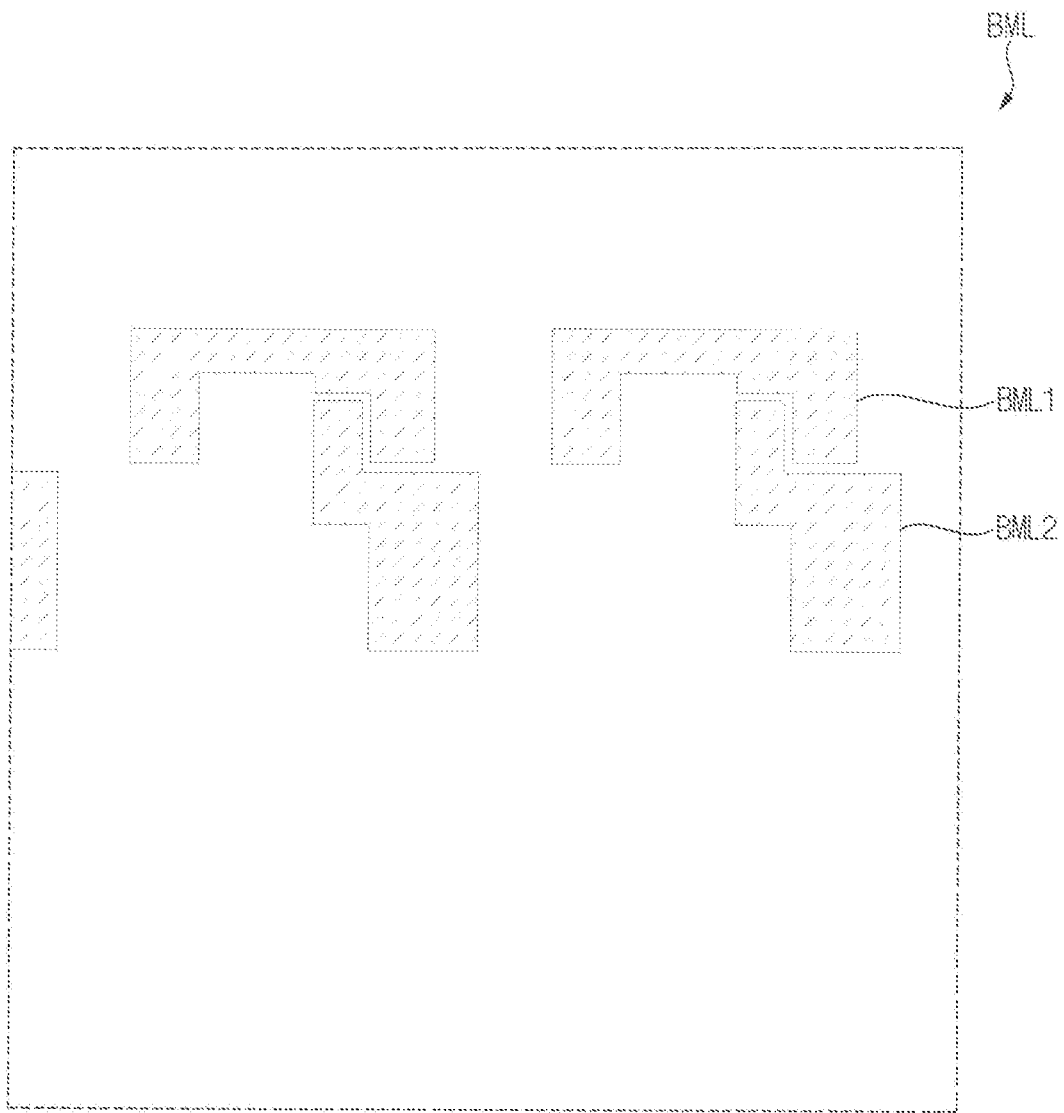
FIGS. 2 to 20 are views for explaining the pixel of FIG. 1 according to some embodiments of the present disclosure.

FIG. 2 is a plan view for explaining a bottom metal electrode BML.

Referring to FIG. 2, the pixel circuit PXCa may include a bottom metal electrode BML. The bottom metal electrode BML may also be referred to as an overlapping layer, a bottom electrode layer, a bottom shield layer, a bottom metal layer, or a bottom light blocking layer.

The bottom metal electrode BML may include a conductive material. For example, the bottom metal electrode BML may include silver, alloys containing silver, molybdenum, alloys containing molybdenum, aluminum, alloys containing aluminum, aluminum nitride, tungsten, tungsten nitride, copper, indium tin oxide, indium zinc oxide, and the like, and these may be used individually or in combination.

The bottom metal electrode BML may include a first bottom metal electrode BML1 and a second bottom metal electrode BML2. The first bottom metal electrode BML1 and the second bottom metal electrode BML2 may be spaced apart from each other when viewed in the plan view.

Figure 7:
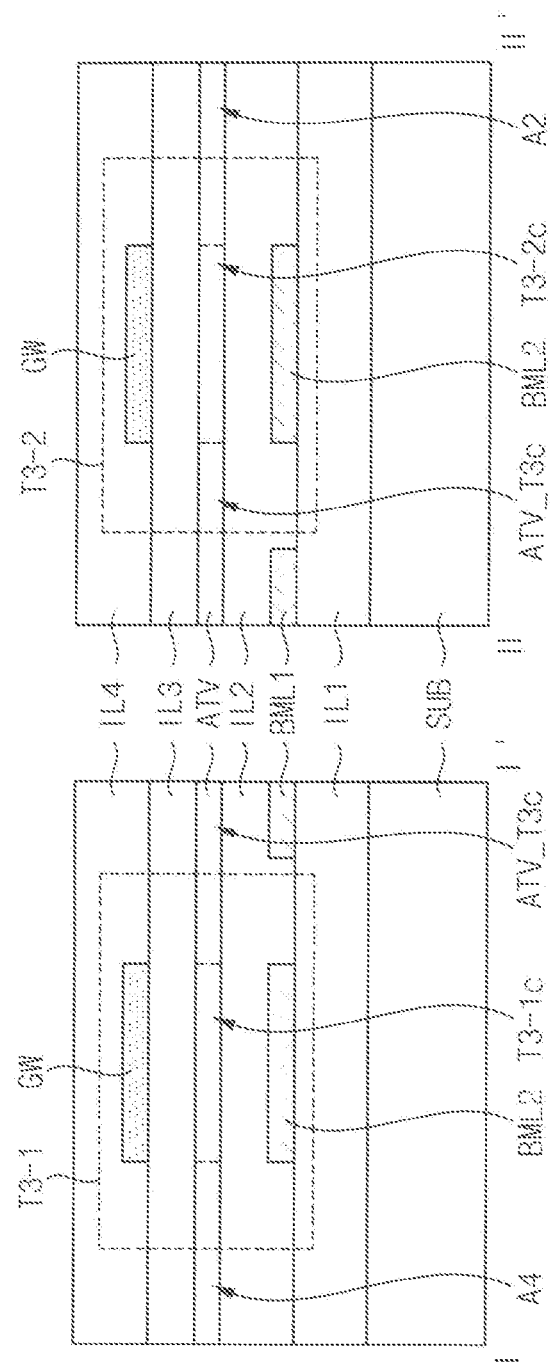

The first bottom metal electrode BML1 and the second bottom metal electrode BML2 may be formed by the same process. For example, the first bottom metal electrode BML1 and the second bottom metal electrode BML2 may contain the same material. In addition, as shown in FIG. 7, the first bottom metal electrode BML1 and the second bottom metal electrode BML2 may be located on the same layer (for example, IL1 in FIG. 7).

Each of the first bottom metal electrode BML1 and the second bottom metal electrode BML2 may be arranged to overlap with a semiconductor layer ATV described later when viewed in the plan view. For example, the first bottom metal electrode BML1 may overlap with a first common area ATV_T3c of the semiconductor layer ATV, so as to define the second terminal of the additional-stabilization capacitor CSA, and the second bottom metal electrode BML2 may overlap with a first sub-channel area T3-1c and a second sub-channel area T3-2c of the semiconductor layer ATV, thereby defining a bottom gate electrode of the first sub-transistor T3-1 and a bottom gate electrode of the second sub-transistor T3-2.

Figure 3:
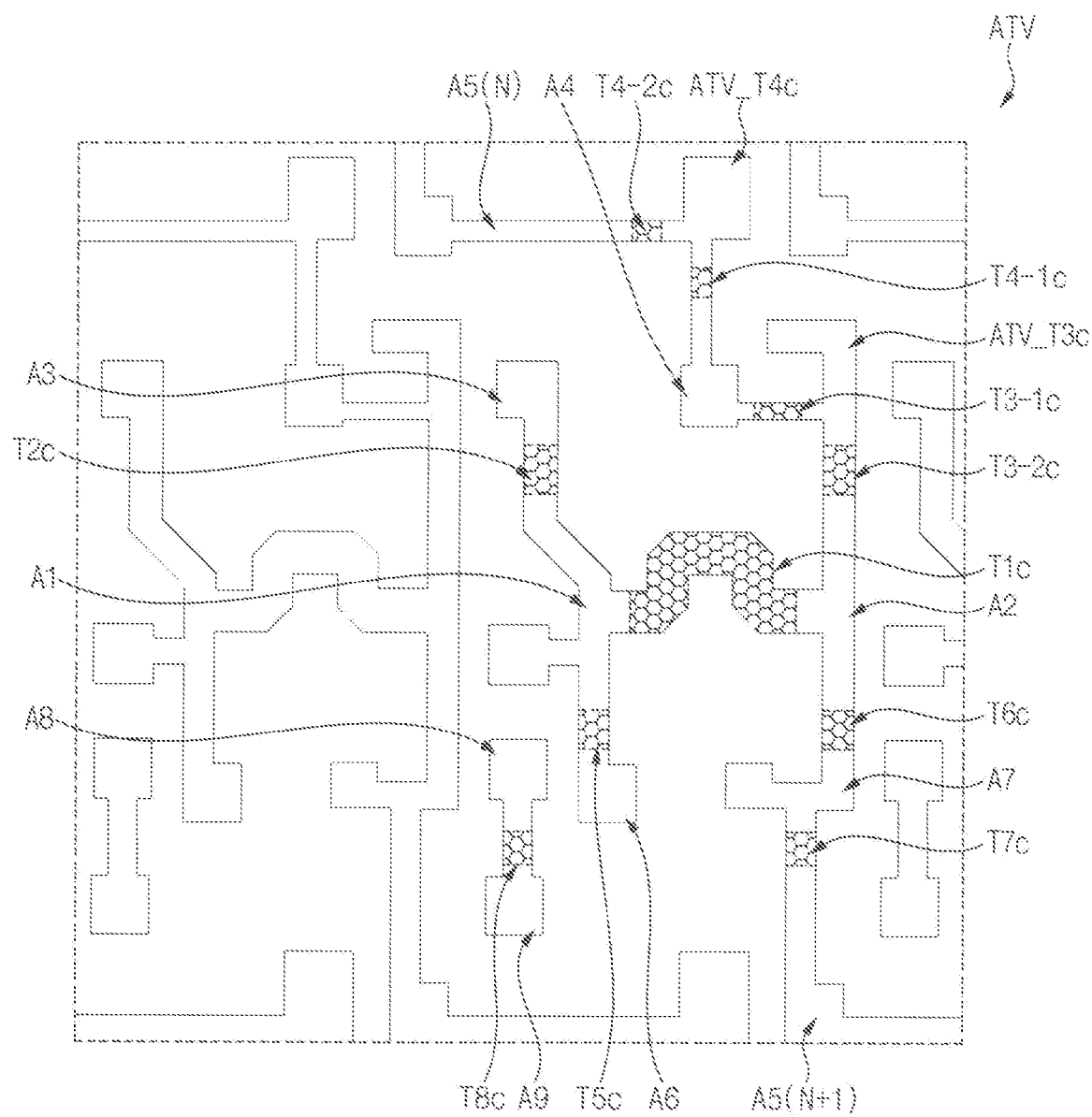

FIG. 3 is a plan view for explaining the semiconductor layer ATV.

Referring to FIG. 3, the pixel circuit PXCa may include a semiconductor layer ATV. The semiconductor layer ATV may include a semiconductor material. According to some embodiments, the semiconductor layer ATV may include a silicon semiconductor material. For example, the semiconductor layer ATV may include amorphous silicon, polycrystalline silicon, and the like. According to some embodiments, the semiconductor layer ATV may include an oxide semiconductor material. For example, the semiconductor layer ATV may include indium-gallium-zinc oxide, indium-gallium oxide, indium-zinc oxide, and the like.

The semiconductor layer ATV may include a first semiconductor area ATV1 having relatively high conductivity, and a second semiconductor area ATV2 having relatively low conductivity. For example, the first semiconductor area ATV1 may be an area doped with an N-type dopant or a P-type dopant, and the second semiconductor area ATV2 may be a non-doped area or an area doped with a concentration lower than a concentration of the first semiconductor area ATV1.

The first semiconductor area ATV1 may include first to ninth areas A1, A2, A3, A4, A5, A6, A7, A8 and A9, a first common area ATV_T3c, and a second common area ATV_T4c. The fifth area A5 may include an N-th area A5(N) included in a pixel circuit in an N-th row, and an (N+1)-th area A5(N+1) included in a pixel circuit in an (N+1)-th row adjacent to the N-th row. The first semiconductor area ATV1 may serve as an electrode, a signal line, an input terminal of a transistor, an output terminal of the transistor, and/or one terminal of a capacitor.

The second semiconductor area ATV2 may include a plurality of channel areas T1c, T2c, T3-1c, T3-2c, T4-1c, T4-2c, T5c, T6c, T7c, and T8c. The second semiconductor area ATV2 is an area overlapping with the first conductive layer C1, and may be an area defining a channel area (or active area) of a transistor.

Figure 4:
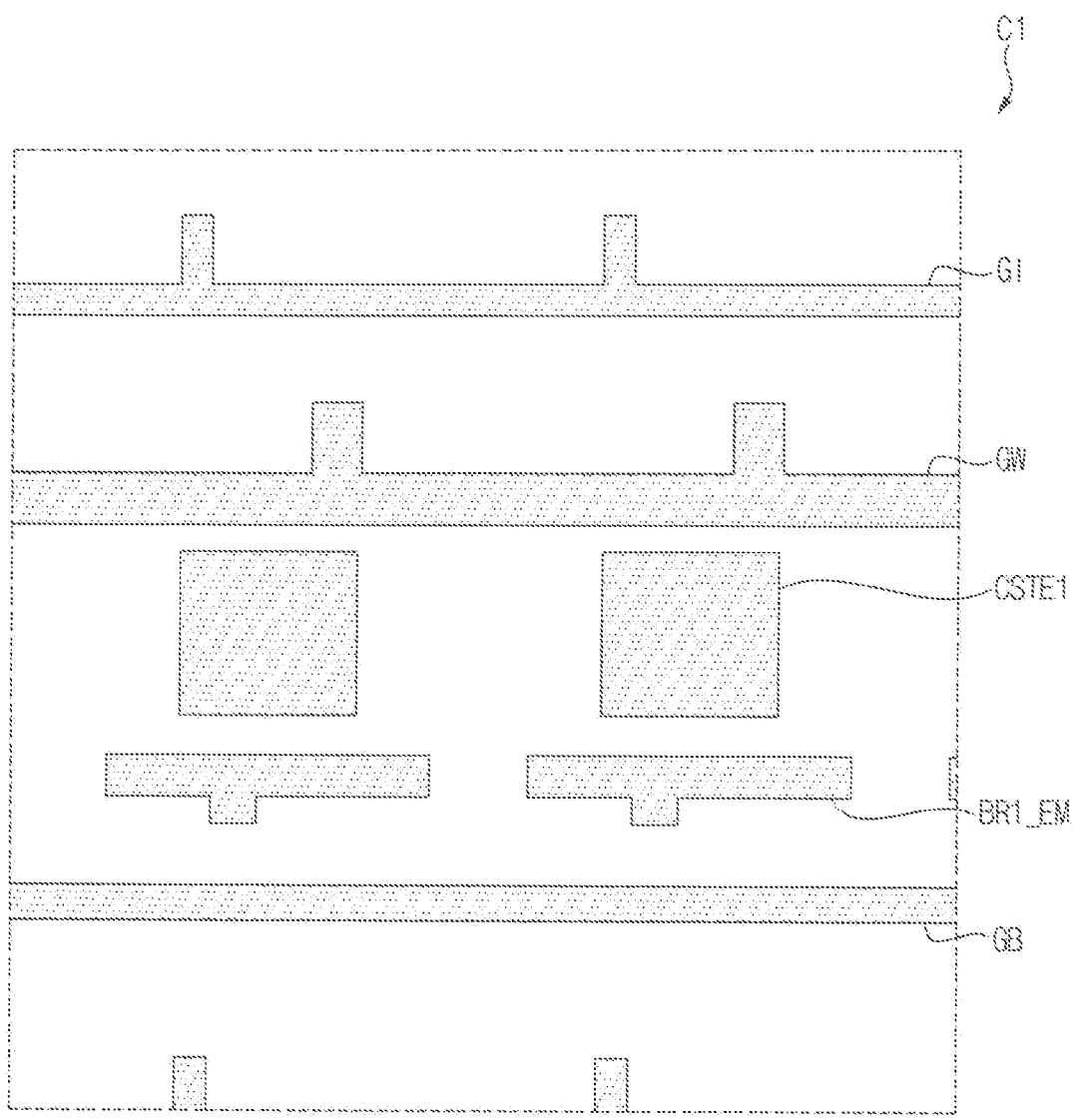

FIG. 4 is a plan view for explaining the first conductive layer C1.

Referring to FIG. 4, the pixel circuit PXCa may include a first conductive layer C1. The first conductive layer C1 may include a conductive material. For example, the first conductive layer C1 may include silver, alloys containing silver, molybdenum, alloys containing molybdenum, aluminum, alloys containing aluminum, aluminum nitride, tungsten, tungsten nitride, copper, indium tin oxide, indium zinc oxide, and the like, and these may be used individually or in combination.

The first conductive layer C1 may include a first gate voltage line GW, a second gate voltage line GI, a third gate voltage line GB, a first light emission control bridge electrode BR1_EM, and a first storage electrode CSTE1.

The first gate voltage may be applied to the first gate voltage line GW, the second gate voltage may be applied to the second gate voltage line GI, and the third gate voltage may be applied to the third gate voltage line GB.

The first light emission control bridge electrode BR1_EM may be electrically connected to a light emission control line (EM in FIGS. 16 and 17) described in more detail later, and accordingly, the light emission control signal may be provided to the first light emission control bridge electrode BR1_EM.

The first conductive layer C1 may overlap with a second area A2 of the semiconductor layer ATV. Specifically, the first storage electrode CSTE1 may overlap with a first channel area T1c, the first gate voltage line GW may overlap with a second channel area ATV2 and a third channel area ATV3, the second gate voltage line GI may overlap with a fourth channel area ATV4, the first light emission control bridge electrode BR1_EM may overlap with a fifth channel area T5c and a sixth channel area T6c, and the third gate voltage line GB may overlap with a seventh channel area T7c and an eighth channel area T8c. Accordingly, the first conductive layer C1 may define the gate electrode of the transistor. The first conductive layer C1 may function as a mask in a process of doping the semiconductor layer ATV.

Figure 5:
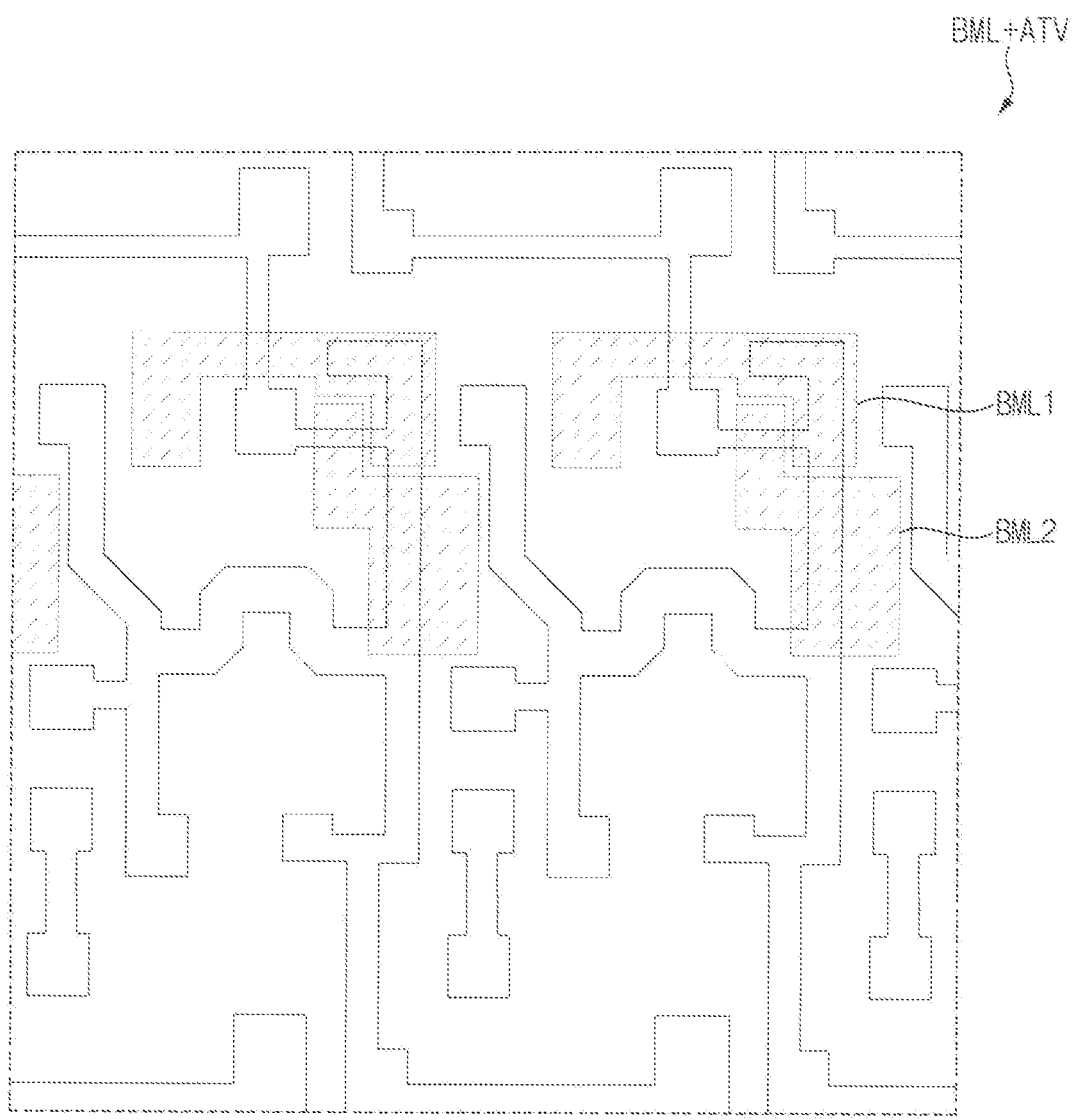
Figure 6:
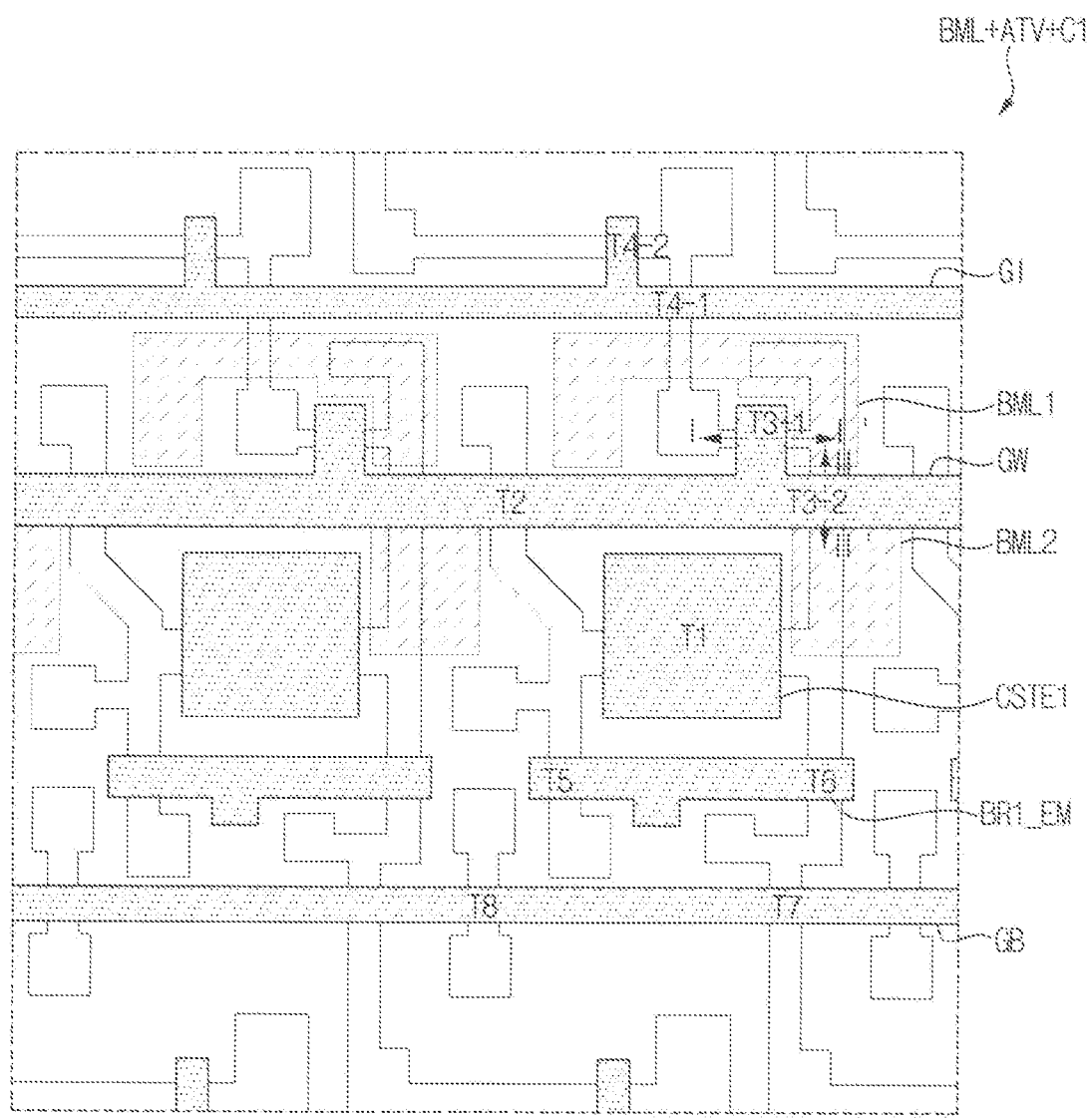

FIGS. 5 and 6 are plan views for explaining the bottom metal electrode BML, the semiconductor layer ATV, and the first conductive layer C1.

Referring to FIGS. 2 to 6, the semiconductor layer ATV may be located on the bottom metal electrode BML, and the first conductive layer C1 may be located on the semiconductor layer ATV.

The bottom metal electrode BML, the semiconductor layer ATV, and the first conductive layer C1 may define the transistors T1, T2, T3, T4, T5, T6, T7, and T8, and the additional-stabilization capacitor CSA described with reference to FIG. 1. Hereinafter, the transistors T1, T2, T3, T4, T5, T6, T7, and T8, and the additional-stabilization capacitor CSA defined by the bottom metal electrode BML, the semiconductor layer ATV, and the first conductive layer C1 will be described.

The driving transistor T1 may be defined by the first storage electrode CSTE1 and the first channel area T1c, the first area A1 and the second area A2 of the semiconductor layer ATV.

Specifically, the first storage electrode CSTE1 may define the gate electrode of the driving transistor T1, and the first channel area T1c may be a channel area of the driving transistor T1. In addition, the first area A1 adjacent to the first channel area T1c may be the input terminal of the driving transistor T1, and the second area A2 adjacent to the first channel area T1c may be the output terminal of the driving transistor T1.

The switching transistor T2 may be defined by the first gate voltage line GW and the second channel area T2c, the first area A1 and the third area A3 of the semiconductor layer ATV.

Specifically, the first gate voltage line GW may define the gate electrode of the switching transistor T2, and the second channel area T2c may be a channel area of the switching transistor T2. In addition, the third area A3 adjacent to the second channel area T2c may be the input terminal of the switching transistor T2, and the first area A1 adjacent to the second channel area T2c may be the output terminal of the switching transistor T2.

The first sub-transistor T3-1 and the second sub-transistor T3-2 may be defined by the first gate voltage line GW, the second bottom metal electrode BML2, and the first sub-channel area T3-1c, the second sub-channel area T3-2c, the second area A2, the fourth area A4 and the first common area ATV_T3c of the semiconductor layer ATV.

The first gate voltage line GW may define a top gate electrode of the first sub-transistor T3-1 and a top gate electrode of the second sub-transistor T3-2. According to some embodiments, when each of the first sub-transistor T3-1 and the second sub-transistor T3-2 is a double-gate transistor, the second bottom metal electrode BML2 may define a bottom gate electrode of the first sub-transistor T3-1 and a bottom gate electrode of the second sub-transistor T3-2.

The first sub-channel area T3-1c may be a channel area of the first sub-transistor T3-1, and the second sub-channel area T3-2c may be a channel area of the second sub-transistor T3-2.

The fourth area A4 adjacent to the first sub-channel area T3-1c may be the output terminal of the first sub-transistor T3-1, and the second area A2 adjacent to the second sub-channel area T3-2c may be the input terminal of the second sub-transistor T3-2.

In addition, in the first common area ATV_T3c, the area adjacent to the first sub-channel area T3-1c may be the input terminal of the first sub-transistor T3-1, and the area adjacent to the second sub-channel area T3-2c may be the output terminal of the second sub-transistor T3-2. In other words, the first common area ATV_T3c may define each of the input terminal of the first sub-transistor T3-1 and the output terminal of the second sub-transistor T3-2. The first common area ATV_T3c may also serve as an electrode (or signal line) for electrically connecting the input terminal of the first sub-transistor T3-1 and the output terminal of the second sub-transistor T3-2 to each other.

The third sub-transistor T4-1 and the fourth sub-transistor T4-2 may be defined by the second gate voltage line GI, and the third sub-channel area T4-1c, the fourth sub-channel area T4-2c, the N-th area A5(N), the fourth area A4 and the second common area ATV_T4c of the semiconductor layer ATV.

The second gate voltage line GI may define the gate electrode of the third sub-transistor T4-1 and the gate electrode of the fourth sub-transistor T4-2, the third sub-channel area T4-1c may be a channel area of the third sub-transistor T4-1, and the fourth sub-channel area T4-2c may be a channel area of the fourth sub-transistor T4-2.

The fourth area A4 adjacent to the third sub-channel area T4-1c may be the output terminal of the third sub-transistor T4-1, and the N-th area A5(N) adjacent to the fourth sub-channel area T4-2c may be the input terminal of the fourth sub-transistor T4-2.

In addition, in the second common area ATV_T4c, the area adjacent to the third sub-channel area T4-1c may be the input terminal of the third sub-transistor T4-1, and the area adjacent to the fourth sub-channel area T4-2c may be the output terminal of the fourth sub-transistor T4-2. In other words, the second common area ATV_T4c may define each of the input terminal of the third sub-transistor T4-1 and the output terminal of the fourth sub-transistor T4-2. In addition, the second common area ATV_T4c may also serve as an electrode (or signal line) for electrically connecting the input terminal of the third sub-transistor T4-1 and the output terminal of the fourth sub-transistor T4-2 to each other.

The first light emission control transistor T5 may be defined by the first light emission control bridge electrode BR1_EM, and the fifth channel area T5c, the sixth area A6 and the first area A1 of the semiconductor layer ATV.

Specifically, the first light emission control bridge electrode BR1_EM may define the gate electrode of the first light emission control transistor T5, and the fifth channel area T5c may be a channel area of the first light emission control transistor T5. In addition, the sixth area A6 adjacent to the fifth channel area T5c may be the input terminal of the first light emission control transistor T5, and the first area A1 adjacent to the fifth channel area T5c may be the output terminal of the first light emission control transistor T5.

The second light emission control transistor T6 may be defined by the first light emission control bridge electrode BR1_EM, and the sixth channel area T6c, the second area A2 and the seventh area A7 of the semiconductor layer ATV.

Specifically, the first light emission control bridge electrode BR1_EM may define the gate electrode of the second light emission control transistor T6, and the sixth channel area T6c may be a channel area of the second light emission control transistor T6. In addition, the second area A2 adjacent to the sixth channel area T6c may be the input terminal of the second light emission control transistor T6, and the seventh area A7 adjacent to the sixth channel area T6c may be the output terminal of the second light emission control transistor T6.

As described above, the first light emission control bridge electrode BR1_EM may simultaneously overlap with the fifth channel area T5c and the sixth channel area T6c of the semiconductor layer ATV. Accordingly, the first light emission control bridge electrode BR1_EM may define each of the gate electrode of the first light emission control transistor T5 and the gate electrode of the second light emission control transistor T6.

The diode initialization transistor T7 may be defined by the third gate voltage line GB, and the seventh channel area T7c, the (N+1)-th area A5(N+1) and the seventh area A7 of the semiconductor layer ATV.

For example, the third gate voltage line GB may define the gate electrode of the diode initialization transistor T7, and the seventh channel area T7c may be the channel area of the diode initialization transistor T7. In addition, the (N+1)-th area A5(N+1) adjacent to the seventh channel area T7c may be the input terminal of the diode initialization transistor T7, and the seventh area A7 adjacent to the seventh channel area T7c may be the output terminal of the diode initialization transistor T7.

The bias transistor T8 may be defined by the third gate voltage line GB, and the eighth channel area T8c, the eighth area A8 and the ninth area A9 of the semiconductor layer ATV.

For example, the third gate voltage line GB may define the gate electrode of the bias transistor T8, and the eighth channel area T8c may be the channel area of the bias transistor T8. In addition, the ninth area A9 adjacent to the eighth channel area T8c may be the input terminal of the bias transistor T8, and the eighth area A8 adjacent to the eighth channel area T8c may be the output terminal of the bias transistor T8.

As described above, the third gate voltage line GB may simultaneously overlap with the seventh channel area T7c and the eighth channel area T8c of the semiconductor layer ATV. Accordingly, the third gate voltage line GB may define each of the gate electrode of the diode initialization transistor T7 and the gate electrode of the bias transistor T8.

The additional-stabilization capacitor CSA may be defined by the first bottom metal electrode BML1, and the first common area ATV_T3c of the semiconductor layer ATV. This will be described later with reference to FIG. 10.

As described above, the bottom metal electrode BML, the semiconductor layer ATV, and the first conductive layer C1 may define the transistors T1, T2, T3, T4, T5, T6, T7 and T8. The first area A1 of the semiconductor layer ATV may also serve as an electrode (or signal line) for electrically connecting two different transistors to each other.

For example, the first area A1 of the semiconductor layer ATV may serve as an electrode for electrically connecting the input terminal of the driving transistor T1, the output terminal of the switching transistor T2, and the output terminal of the first light emission control transistor T5 to each other.

For another example, the second area A2 of the semiconductor layer ATV may serve as an electrode for electrically connecting the output terminal of the driving transistor T1, the input terminal of the second sub-transistor T3-2, and the input terminal of the second light emission control transistor T6 to each other.

For still another example, the seventh area A7 of the semiconductor layer ATV may serve as an electrode for electrically connecting the output terminal of the second light emission control transistor T6 and the output terminal of the diode initialization transistor T7 to each other, and the fourth area A4 of the semiconductor layer ATV may serve as an electrode for electrically connecting the output terminal of the first sub-transistor T3-1 and the output terminal of the third sub-transistor T4-1 to each other.

FIG. 7 is a sectional view taken along lines I-I' and II-II' of FIG. 6.

Referring to FIG. 7, the display device according to some embodiments of the present disclosure may include a substrate SUB, a first insulating layer IL1, a second insulating layer IL2, a third insulating layer IL3, and a fourth insulating layer IL4.

The substrate SUB may include glass, quartz, sapphire, and the like. The first insulating layer IL1, the second insulating layer IL2, the third insulating layer IL3, and the fourth insulating layer IL4 may be sequentially laminated on the substrate SUB.

Each of the first to fourth insulating layers IL1, IL2, IL3 and IL4 may include an inorganic insulating material. For example, each of the first to fourth insulating layers IL1, IL2, IL3 and IL4 may include aluminum oxide, titanium oxide, silicon oxide, silicon nitride, silicon oxynitride, zirconium oxide, hafnium oxide, and the like, and these may be used individually or in combination. In addition, each of the first to fourth insulating layers IL1, IL2, IL3 and IL4 may have a single-layer or multi-layer structure including at least one of the above-described materials.

The bottom metal electrode BML may be located on the first insulating layer IL1, and the second insulating layer IL2 may cover the bottom metal electrode BML. For example, as shown in FIG. 7, the second bottom metal electrode BML2 may be located on the first insulating layer IL1, and the second insulating layer IL2 may cover the second bottom metal electrode BML2.

The semiconductor layer ATV may be located on the second insulating layer IL2, and the third insulating layer IL3 may cover the semiconductor layer ATV.

The first conductive layer C1 may be located on the third insulating layer IL3, and the fourth insulating layer IL4 may cover the first conductive layer C1. For example, as shown in FIG. 7, the first gate voltage line GW may be located on the third insulating layer IL3, and the fourth insulating layer IL4 may cover the first gate voltage line GW.

The second bottom metal electrode BML2, the semiconductor layer ATV, and the first gate voltage line GW may define a first sub-transistor T3-1 and a second sub-transistor T3-2 each having a double-gate structure. The second bottom metal electrode BML2 may overlap with the first sub-channel area T3-1c and the second sub-channel area T3-2c of the semiconductor layer ATV, so that may define each bottom gate electrode of the first sub-transistor T3-1 and the second sub-transistor T3-2, and the first gate voltage line GW may overlap with the first sub-channel area T3-1c and the second sub-channel area T3-2c of the semiconductor layer ATV, so that may define each top gate electrode of the first sub-transistor T3-1 and the second sub-transistor T3-2.

Accordingly, each of the first sub-transistor T3-1 and the second sub-transistor T3-2 has the double-gate structure, so that each voltage level of the first sub-transistor T3-1 and the second sub-transistor T3-2 may be maintained relatively constantly. Accordingly, leakage current in the first sub-transistor T3-1 and the second sub-transistor T3-2 may be reduced, and low-frequency characteristics of the display device may be improved.

Figure 8:
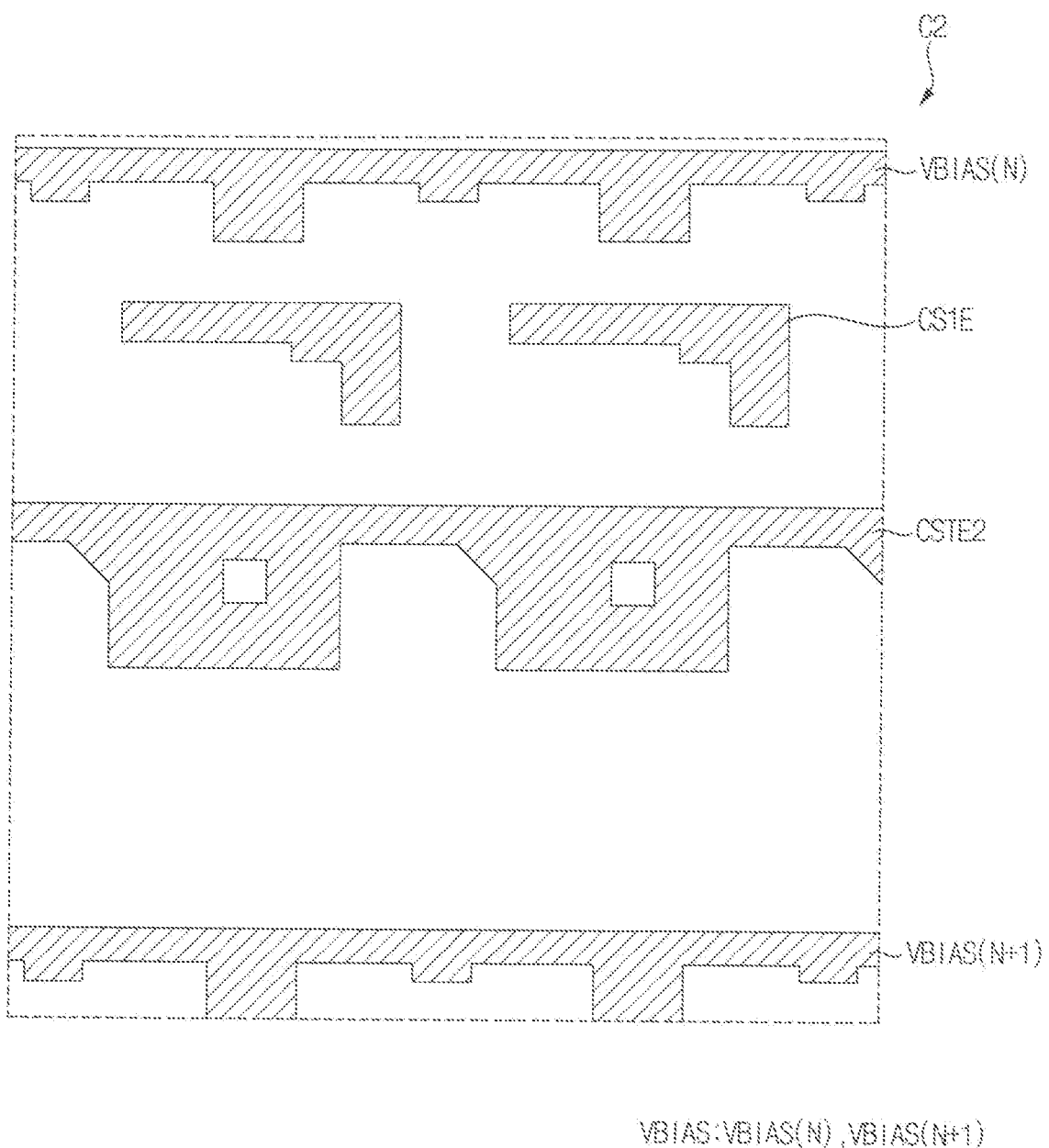

FIG. 8 is a plan view for explaining the second conductive layer C2.

Referring to FIG. 8, the pixel circuit PXCa may include a second conductive layer C2. The second conductive layer C2 may include a conductive material. For example, the second conductive layer C2 may include silver, alloys containing silver, molybdenum, alloys containing molybdenum, aluminum, alloys containing aluminum, aluminum nitride, tungsten, tungsten nitride, copper, indium tin oxide, indium zinc oxide, and the like, and these may be used individually or in combination.

The second conductive layer C2 may include a first stabilization electrode CS1E, a bias voltage line VBIAS, and a second storage electrode CSTE2.

The bias voltage may be applied to the bias voltage line VBIAS. The bias voltage line VBIAS may include an N-th bias voltage line VBIAS(N) included in the pixel circuit of the N-th row, and an (N+1)-th bias voltage line VBIAS(N+1) included in the pixel circuit of the (N+1)-th row.

Figure 9:
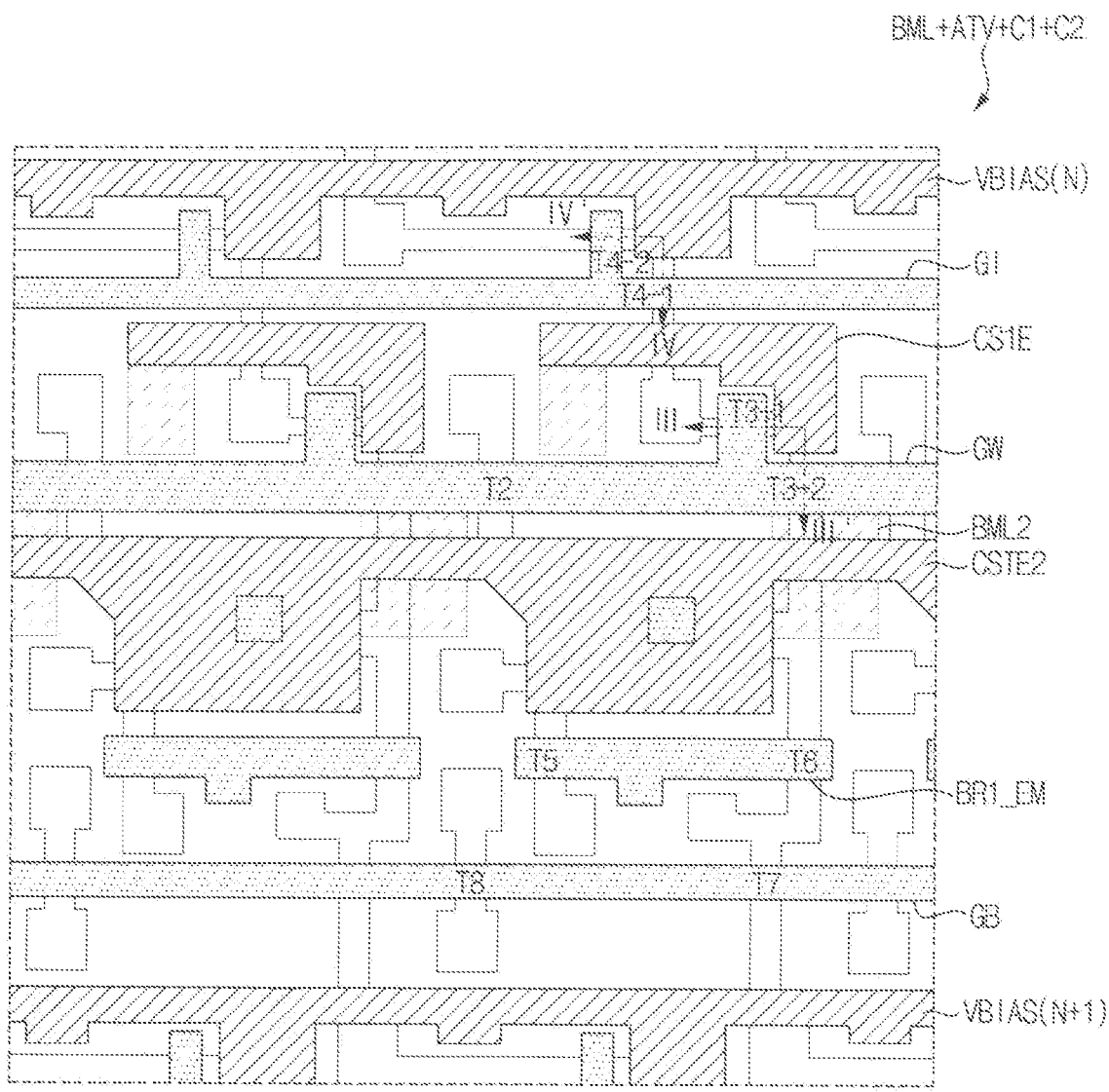

FIG. 9 is a plan view for explaining the bottom metal electrode BML, the semiconductor layer ATV, the first conductive layer C1, and the second conductive layer C2.

Referring to FIG. 9, the second conductive layer C2 may be located on the bottom metal electrode BML, the semiconductor layer ATV, and the first conductive layer C1.

The first stabilization electrode CS1E may overlap with the first common area ATV_T3c of the semiconductor layer ATV defining the input terminal of the first sub-transistor T3-1 and the output terminal of the second sub-transistor T3-2, thereby defining the additional-stabilization capacitor CSA. This will be described later with reference to FIG. 10.

The N-th bias voltage line VBIAS(N) may overlap with the second common area ATV_T4c of the semiconductor layer ATV defining the input terminal of the third sub-transistor T4-1 and the output terminal of the fourth sub-transistor T4-2, thereby defining the second stabilization capacitor CS2. This will be described later with reference to FIG. 10.

The second storage electrode CSTE2 may overlap with the first storage electrode CSTE1, thereby defining the storage capacitor CST. The first storage electrode CSTE1 may define the first terminal of the storage capacitor CST, and the second storage electrode CSTE2 may define the second terminal of the storage capacitor CST. As shown in FIG. 9, the second storage electrode CSTE2 may define an opening for exposing a part of the first storage electrode CSTE1.

Figure 10:
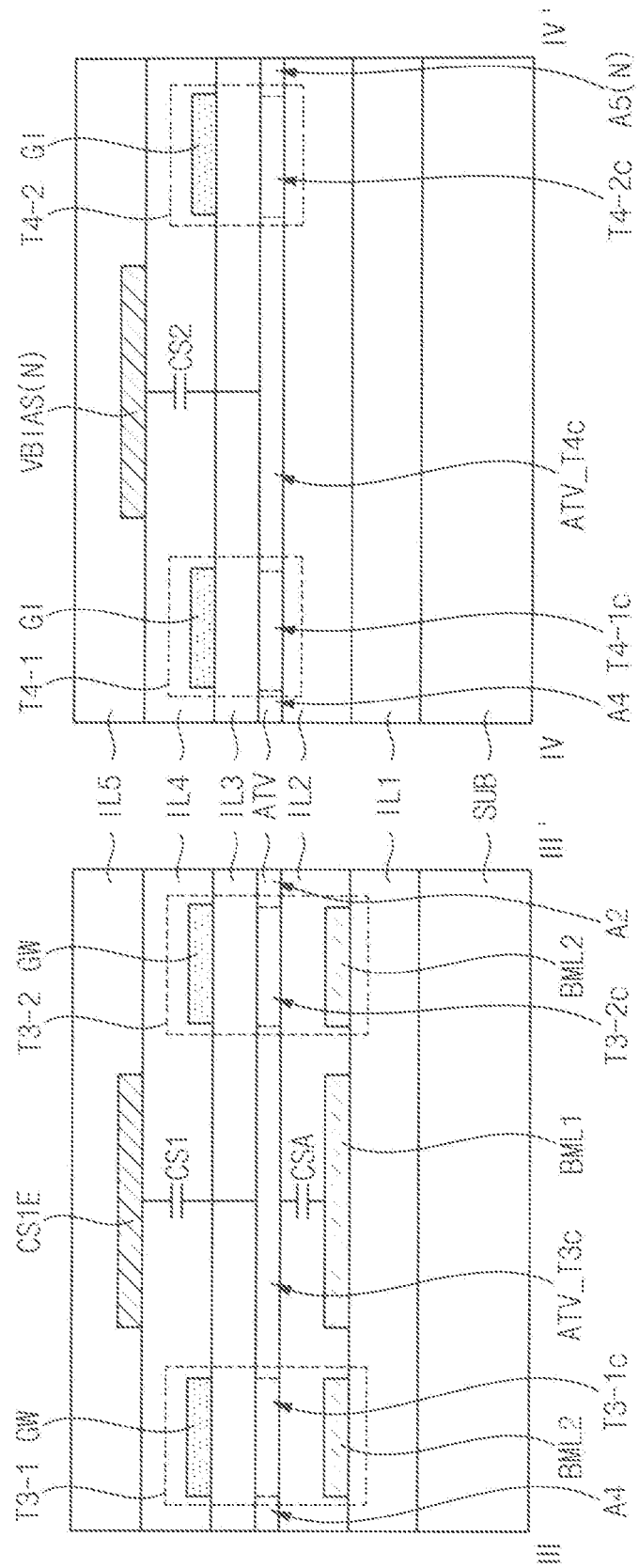

FIG. 10 is a sectional view taken along lines III-Ill' and IV-IV' of FIG. 9.

Referring to FIG. 10, the fifth insulating layer IL5 may be located on the fourth insulating layer IL4. The fifth insulating layer IL5 may include an inorganic insulating material. For example, the fifth insulating layer IL5 may include aluminum oxide, titanium oxide, silicon oxide, silicon nitride, silicon oxynitride, zirconium oxide, hafnium oxide, and the like, and these may be used individually or in combination. In addition, the fifth insulating layer IL5 may have a single-layer or multi-layer structure including at least one of the above-described materials.

The second conductive layer C2 may be located on the fourth insulating layer IL4, and the fifth insulating layer IL5 may cover the second conductive layer C2. For example, as shown in FIG. 10, the first stabilization electrode CS1E and the N-th bias voltage line VBIAS(N) may be located on the fourth insulating layer IL4, and the fifth insulating layer IL5 may cover the first stabilization electrode CS1E and the N-th bias voltage line VBIAS(N).

The first bottom metal electrode BML1 may overlap with a first common area ATV_T3c of the semiconductor layer ATV, thereby defining the additional-stabilization capacitor CSA. The first common area ATV_T3c of the semiconductor layer ATV may define the first terminal of the additional-stabilization capacitor CSA, and the first bottom metal electrode BML1 may define the second terminal of the additional-stabilization capacitor CSA.

The first stabilization electrode CS1E may overlap with a first common area ATV_T3c of the semiconductor layer ATV, thereby defining the first stabilization capacitor CS1. The first common area ATV_T3c of the semiconductor layer ATV may define the first terminal of the first stabilization capacitor CS1, and the first stabilization electrode CS1E may define the second terminal of the first stabilization capacitor CS1.

The N-th bias voltage line VBIAS(N) may overlap with the second common area ATV_T4c of the semiconductor layer ATV, thereby defining the second stabilization capacitor CS2. The second common area ATV_T4c of the semiconductor layer ATV may define the first terminal of the second stabilization capacitor CS2, and the N-th bias voltage line VBIAS(N) may define the second terminal of the second stabilization capacitor CS2.

Figure 11:
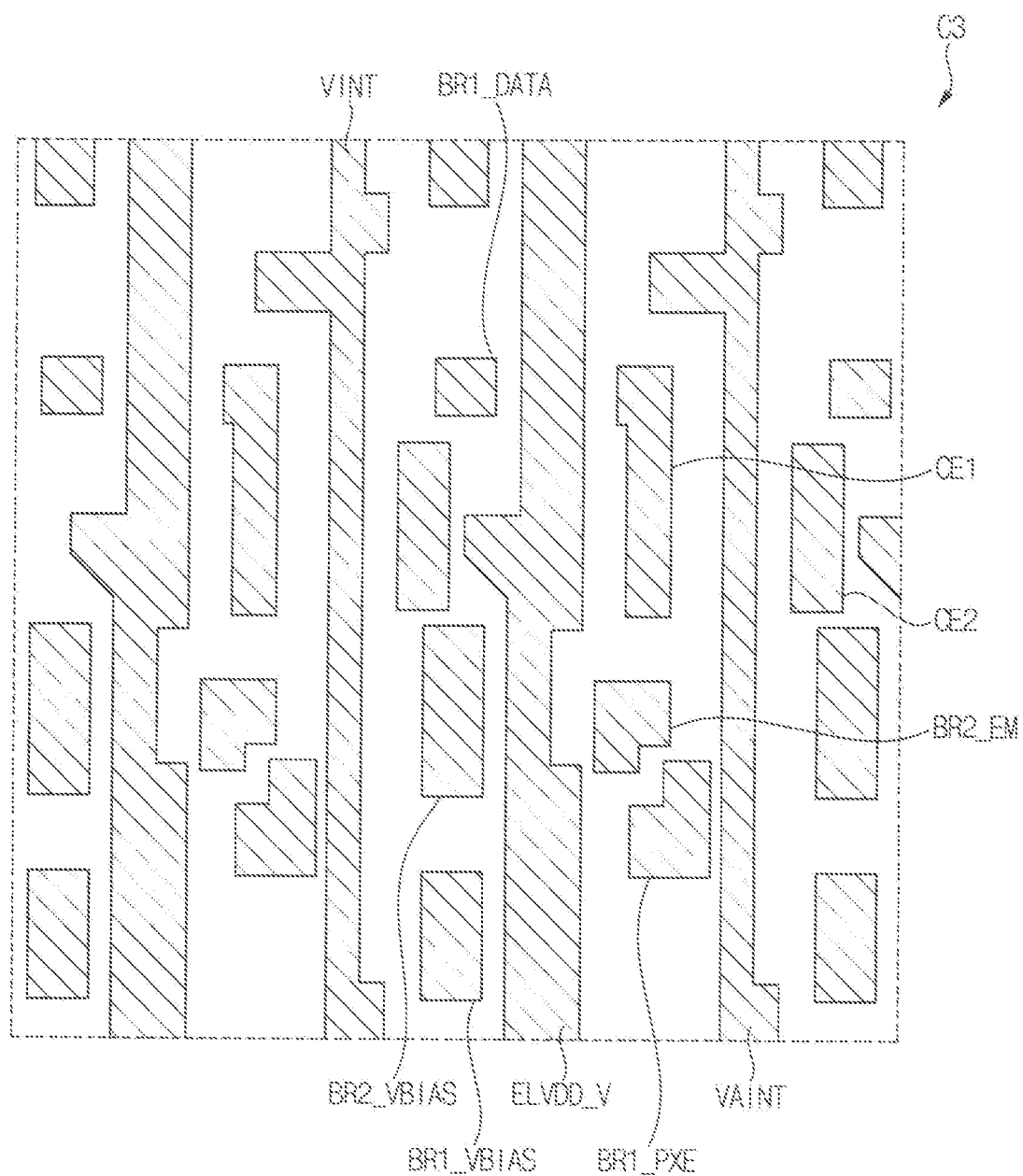

FIG. 11 is a plan view for explaining a third conductive layer C3.

Referring to FIG. 11, the pixel circuit PXa may include a third conductive layer C3. The third conductive layer C3 may include a conductive material. For example, the third conductive layer C3 may include silver, alloys containing silver, titanium, alloys containing titanium, molybdenum, alloys containing molybdenum, aluminum, alloys containing aluminum, aluminum nitride, tungsten, tungsten nitride, copper, indium tin oxide, indium zinc oxide, and the like, and these may be used individually or in combination. In addition, the third conductive layer C3 may have a single-layer or multi-layer structure including at least one of the above-described materials.

The third conductive layer C3 may include an initialization voltage line VINT, a first vertical power voltage line ELVDD_V, a diode initialization voltage line VAINT, a first connection electrode CE1, a second connection electrode CE2, a first pixel bridge electrode BR1_PXE, a first bias bridge electrode BR1_VBIAS, a second bias bridge electrode BR2_VBIAS, a second light emission control bridge electrode BR2_EM, and a first data bridge electrode BR1_DATA.

The initialization voltage may be applied to the initialization voltage line VINT, the first power voltage may be applied to the first vertical power voltage line ELVDD_V, and the diode initialization voltage may be applied to the diode initialization voltage line VAINT.

Figure 12:
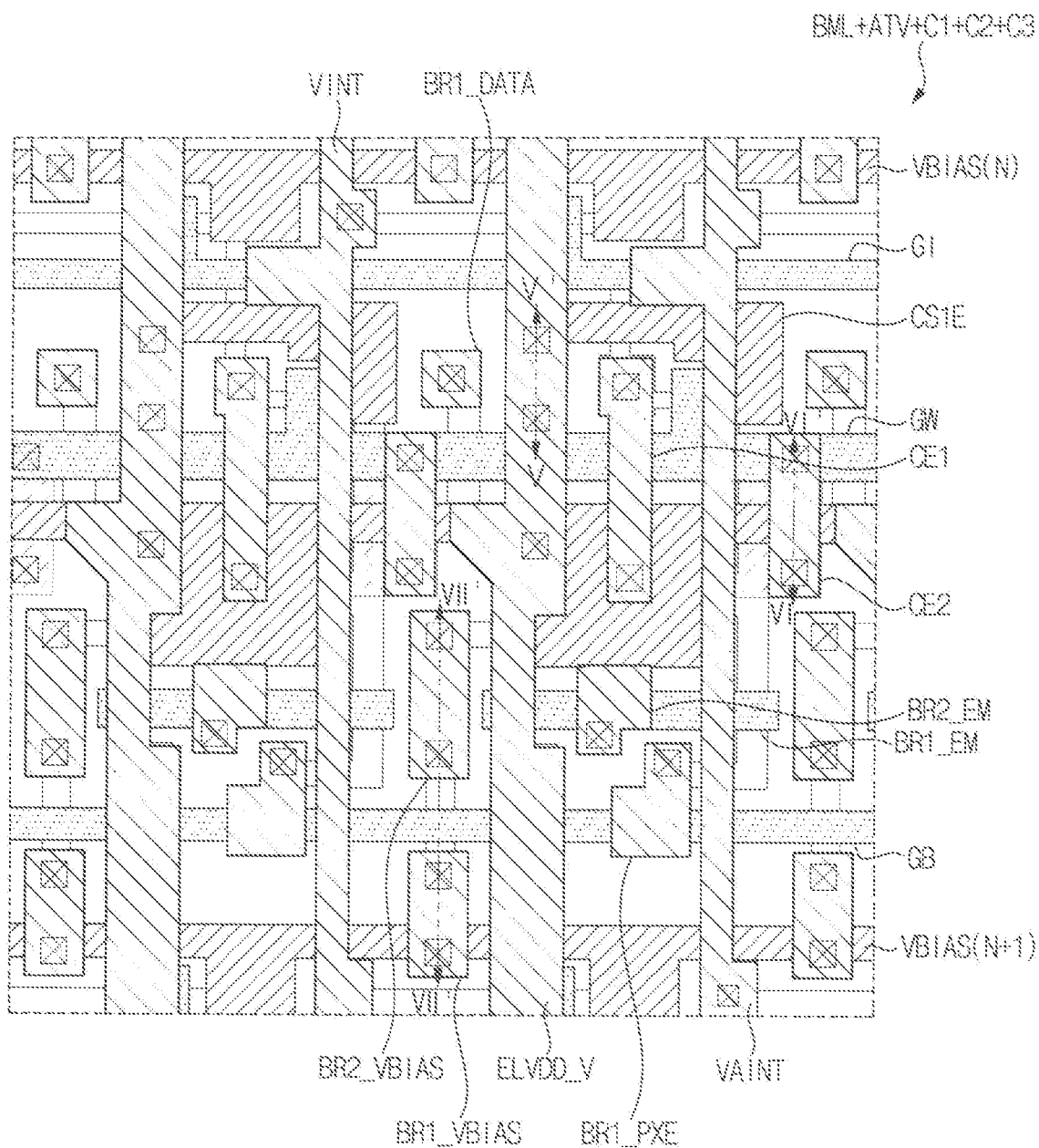

FIG. 12 is a plan view for explaining the bottom metal electrode BML, the semiconductor layer ATV, the first conductive layer C1, the second conductive layer C2, and the third conductive layer C3.

Referring to FIG. 12, the third conductive layer C3 may be located on the bottom metal electrode BML, the semiconductor layer ATV, the first conductive layer C1 and the second conductive layer C2.

The initialization voltage line VINT may electrically come into contact with the N-th area A5(N) of the semiconductor layer ATV. Accordingly, the initialization voltage line VINT may provide the initialization voltage to the input terminal of the fourth sub-transistor T4-2.

The first vertical power voltage line ELVDD_V may electrically come into contact with the second storage electrode CSTE2. Accordingly, the first vertical power voltage line ELVDD_V may provide the first power voltage to the second storage electrode CSTE2.

In addition, the first vertical power voltage line ELVDD_V may electrically come into contact with each of the first stabilization electrode CS1E and the first bottom metal electrode BML1. Accordingly, the first vertical power voltage line ELVDD_V may electrically connect the first stabilization electrode CS1E and the first bottom metal electrode BML1 to each other, and may provide the first power voltage to each of the first stabilization electrode CS1E and the first bottom metal electrode BML1. This will be described later with reference to FIG. 13.

The diode initialization voltage line VAINT may electrically come into contact with the (N+1)-th area A5(N+1) of the semiconductor layer ATV. Accordingly, the diode initialization voltage line VAINT may provide the diode initialization voltage to the input terminal of the diode initialization transistor T7.

The first connection electrode CE1 may electrically come into contact with the first storage electrode CSTE1 and the fourth area A4 of the semiconductor layer ATV. Accordingly, the first connection electrode CE1 may electrically connect the first storage electrode CSTE1, the output terminal of the first sub-transistor T3-1, and the output terminal of the third sub-transistor T4-1 to each other.

The second connection electrode CE2 may electrically come into contact with each of the first gate voltage line GW and the second bottom metal electrode BML2. Accordingly, the second connection electrode CE2 may electrically connect the first gate voltage line GW and the second bottom metal electrode BML2 to each other.

The first pixel bridge electrode BR1_PXE may electrically come into contact with the seventh area A7 of the semiconductor layer ATV.

The first bias bridge electrode BR1_VBIAS may electrically come into contact with each of the (N+1)-th bias voltage line VBIAS(N+1) and the ninth area A9 of the semiconductor layer ATV. Accordingly, the first bias bridge electrode BR1_VBIAS may electrically connect the (N+1)-th bias voltage line VBIAS(N+1) and the input terminal of the bias transistor T8 to each other, and the bias voltage may be provided to the input terminal of the bias transistor T8 through the first bias bridge electrode BR1_VBIAS.

The second bias bridge electrode BR2_VBIAS may be electrically connected to each of the first area A1 and the eighth area A8 of the semiconductor layer ATV. Accordingly, the second bias bridge electrode BR2_VBIAS may electrically connect the output terminal of the bias transistor T8 and the input terminal of the driving transistor T1 to each other, and a signal outputted from the output terminal of the bias transistor T8 may be provided to the input terminal of the driving transistor T1 through the second bias bridge electrode BR2_VBIAS.

The second light emission control bridge electrode BR2_EM may electrically come into contact with the first light emission control bridge electrode BR1_EM.

The first data bridge electrode BR1_DATA may electrically come into contact with the third area A3 of the semiconductor layer ATV.

Figure 13:
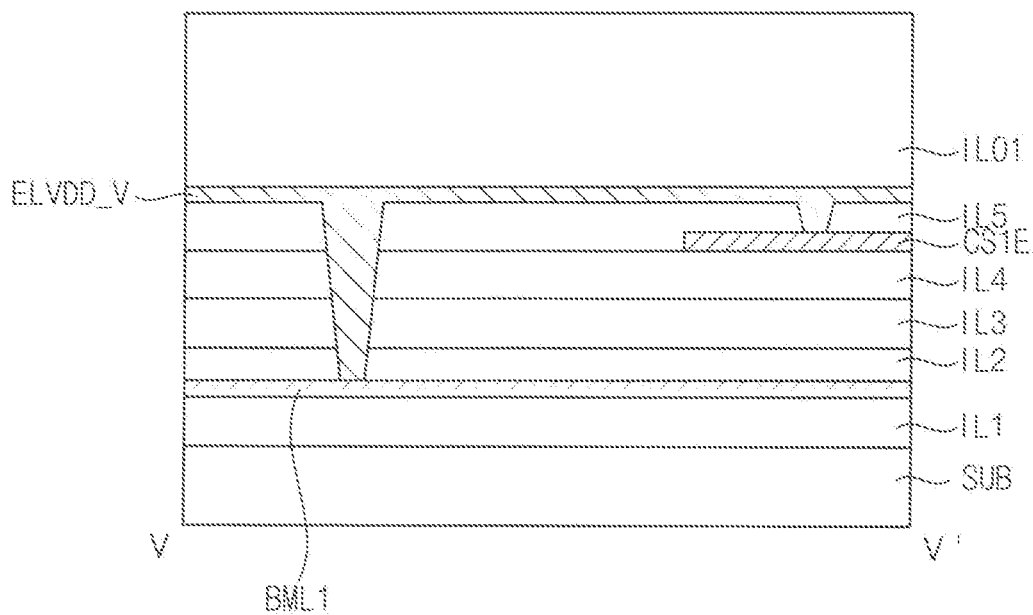
Figure 14:
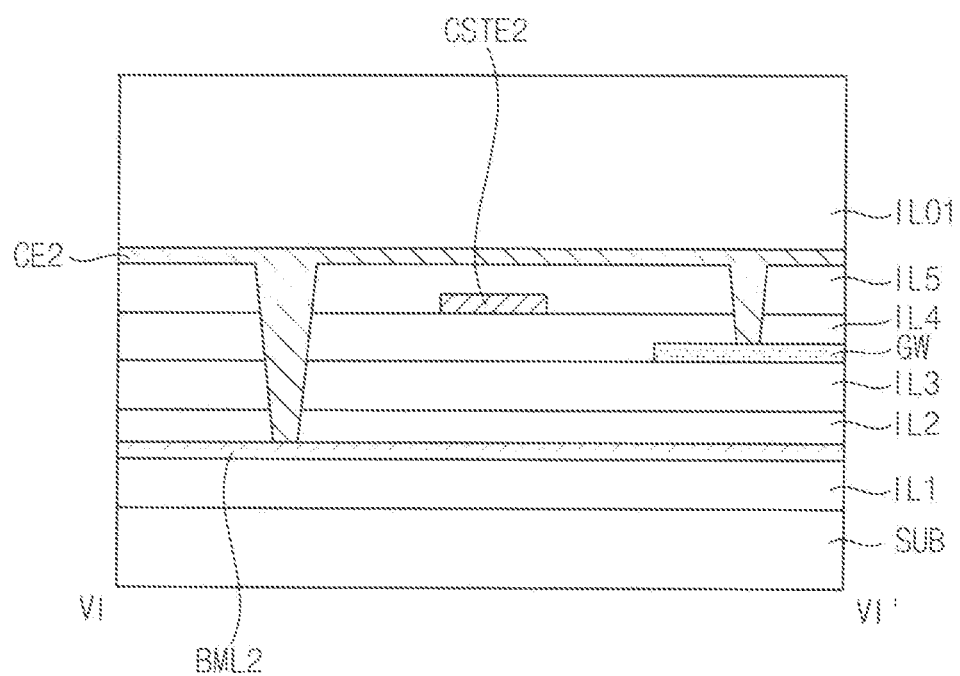
Figure 15:
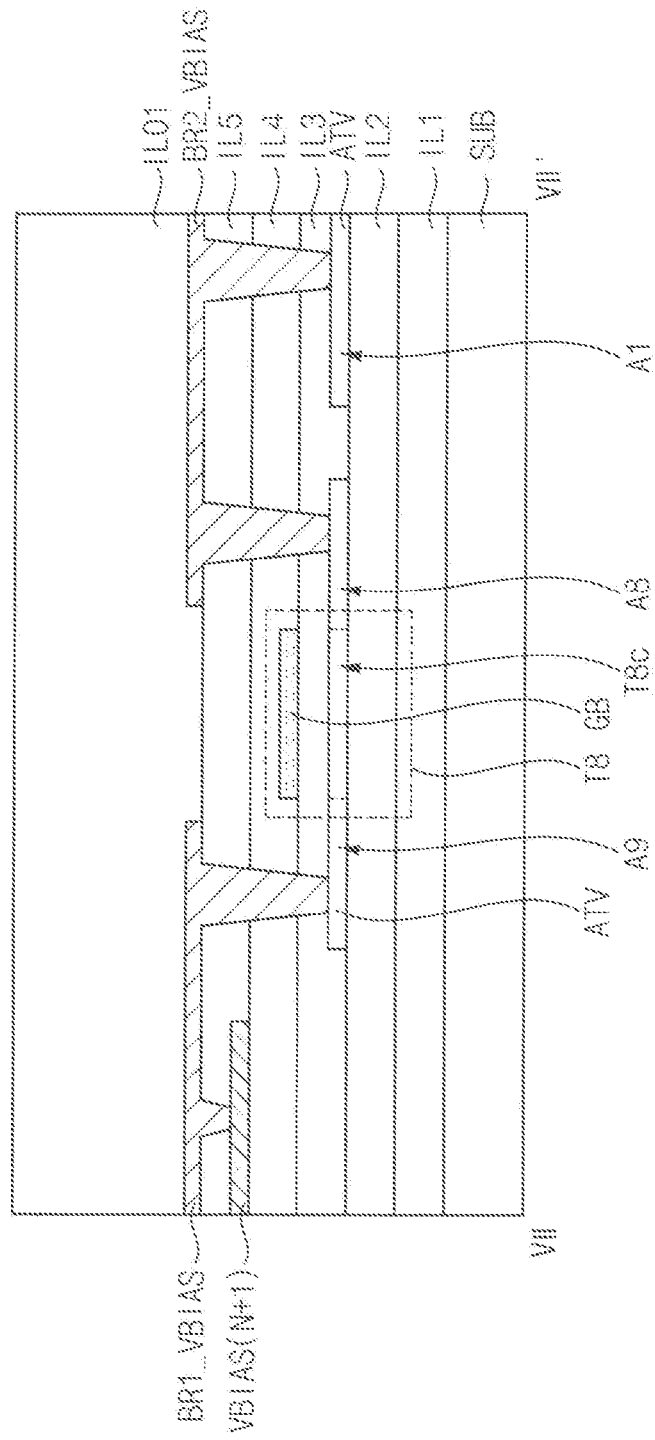

FIG. 13 is a sectional view taken along line V-V' of FIG. 12. FIG. 14 is a sectional view taken along line VI-VI' of FIG. 12. FIG. 15 is a sectional view taken along line VII-VII' of FIG. 12.

Referring to FIGS. 13 to 15, the first organic insulating layer IL01 may be located on the fifth insulating layer IL5, and may include an organic insulating material. For example, the first organic insulating layer IL01 may include at least one of acrylic resin, methacrylic resin, polyisoprene, vinyl-based resin, epoxy-based resin, urethane-based resin, cellulose-based resin, siloxane-based resin, polyimide-based resin, polyamide-based resin, or perylene-based resin.

The third conductive layer C3 may be located on the fifth insulating layer IL5, and the first organic insulating layer IL01 may cover the third conductive layer C3. For example, as shown in FIGS. 13 to 15, each of the first vertical power voltage line ELVDD_V, the second connection electrode CE2, the first bias bridge electrode BR1_VBIAS, and the second bias bridge electrode BR2_VBIAS may be located on the fifth insulating layer IL5, and the first organic insulating layer IL01 may cover each of the first vertical power voltage line ELVDD_V, the second connection electrode CE2, the first bias bridge electrode BR1_VBIAS, and the second bias bridge electrode BR2_VBIAS.

Referring to FIG. 13, the first vertical power voltage line ELVDD_V may electrically come into contact with each of the first bottom metal electrode BML1 and the first stabilization electrode CS1E. Accordingly, the first vertical power voltage line ELVDD_V may electrically connect the first bottom metal electrode BML1 and the first stabilization electrode CS1E.

The first power voltage is applied to the first vertical power voltage line ELVDD_V, so that the first power voltage may be applied to each of the first bottom metal electrode BML1 and the first stabilization electrode CS1E. According to some embodiments, the first power voltage may be a constant voltage signal. The same constant voltage signal may be applied to each of the first bottom metal electrode BML1 and the first stabilization electrode CS1E.

Referring to FIG. 14, the second connection electrode CE2 may electrically come into contact with each of the second bottom metal electrode BML2 and the first gate voltage line GW. Accordingly, the first gate voltage applied to the first gate voltage line GW may be provided to the second bottom metal electrode BML2.

Referring to FIG. 15, the first bias bridge electrode BR1_VBIAS may electrically come into contact with each of the (N+1)-th bias voltage line VBIAS(N+1) and the ninth area A9 of the semiconductor layer ATV. Accordingly, the bias voltage applied to the (N+1)-th bias voltage line VIBAS(N+1) may be provided to the input terminal of the bias transistor T8.

In addition, the second bias bridge electrode BR2_VBIAS may electrically come into contact with each of the first area A1 and the eighth area A8 of the semiconductor layer ATV. Accordingly, the signal outputted from the output terminal of the bias transistor T8 may be provided to the input terminal of the driving transistor T1.

Figure 16:
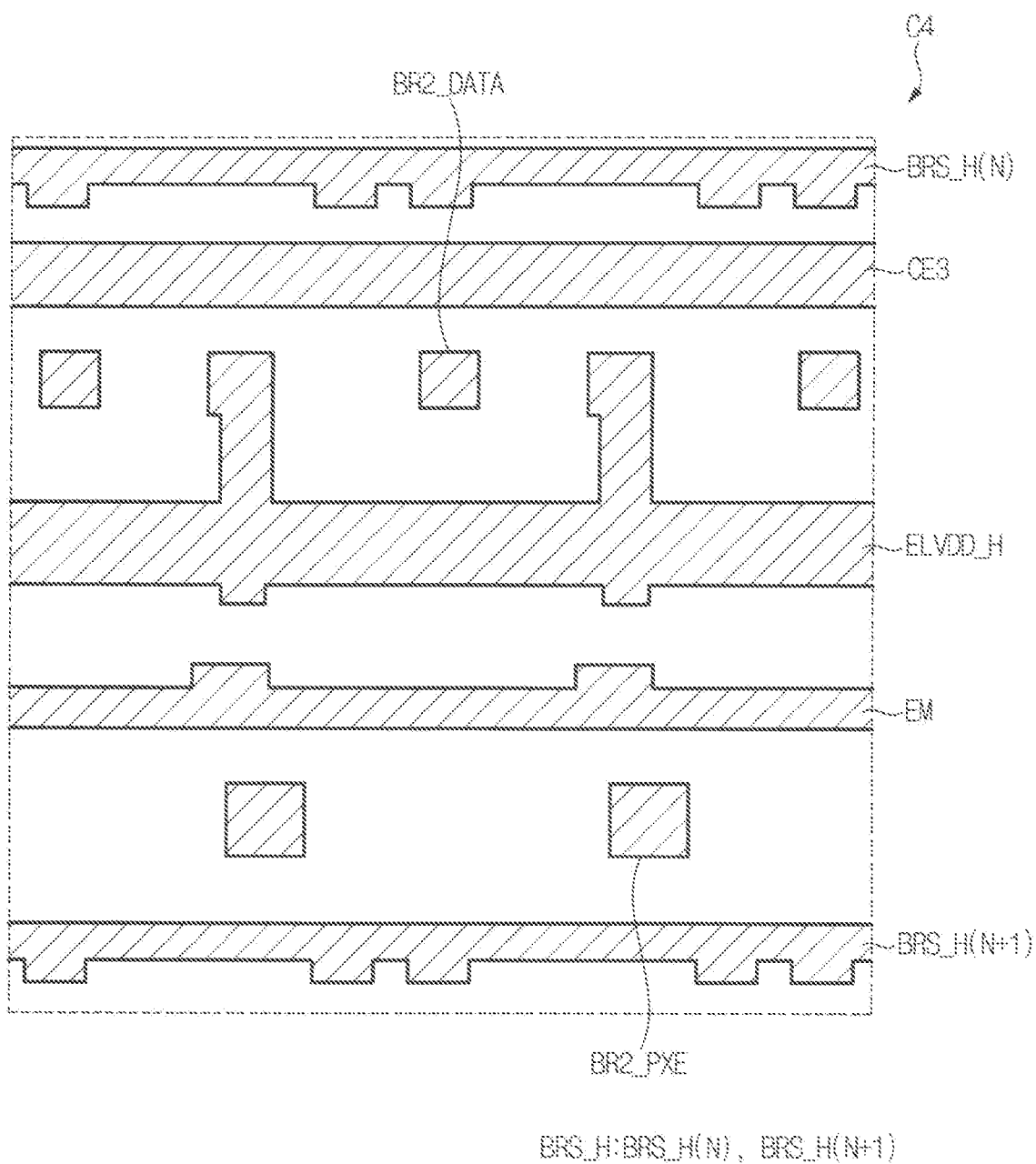

FIG. 16 is a plan view for explaining a fourth conductive layer C4.

Referring to FIG. 16, the pixel circuit PXa may include a fourth conductive layer C4. The fourth conductive layer C4 may include a conductive material. For example, the fourth conductive layer C4 may include silver, alloys containing silver, titanium, alloys containing titanium, molybdenum, alloys containing molybdenum, aluminum, alloys containing aluminum, aluminum nitride, tungsten, tungsten nitride, copper, indium tin oxide, indium zinc oxide, and the like, and these may be used individually or in combination. In addition, the fourth conductive layer C4 may have a single-layer or multi-layer structure including at least one of the above-described materials.

The fourth conductive layer C4 may include a horizontal bridge line BRS_H, a third connection electrode CE3, a light emission control line EM, a first horizontal power voltage line ELVDD_H, a second data bridge electrode BR2_DATA, and a second pixel bridge electrode BR2_PXE.

The first power voltage may be applied to the first horizontal power voltage line ELVDD_H, and the light emission control signal may be applied to the light emission control line EM.

The horizontal bridge line BRS_H may include an N-th horizontal bridge line BRS_H(N) included in the pixel circuit of the N-th row, and an (N+1)-th horizontal bridge line BRS_H(N+1) included in the pixel circuit of the (N+1)-th row.

Figure 17:
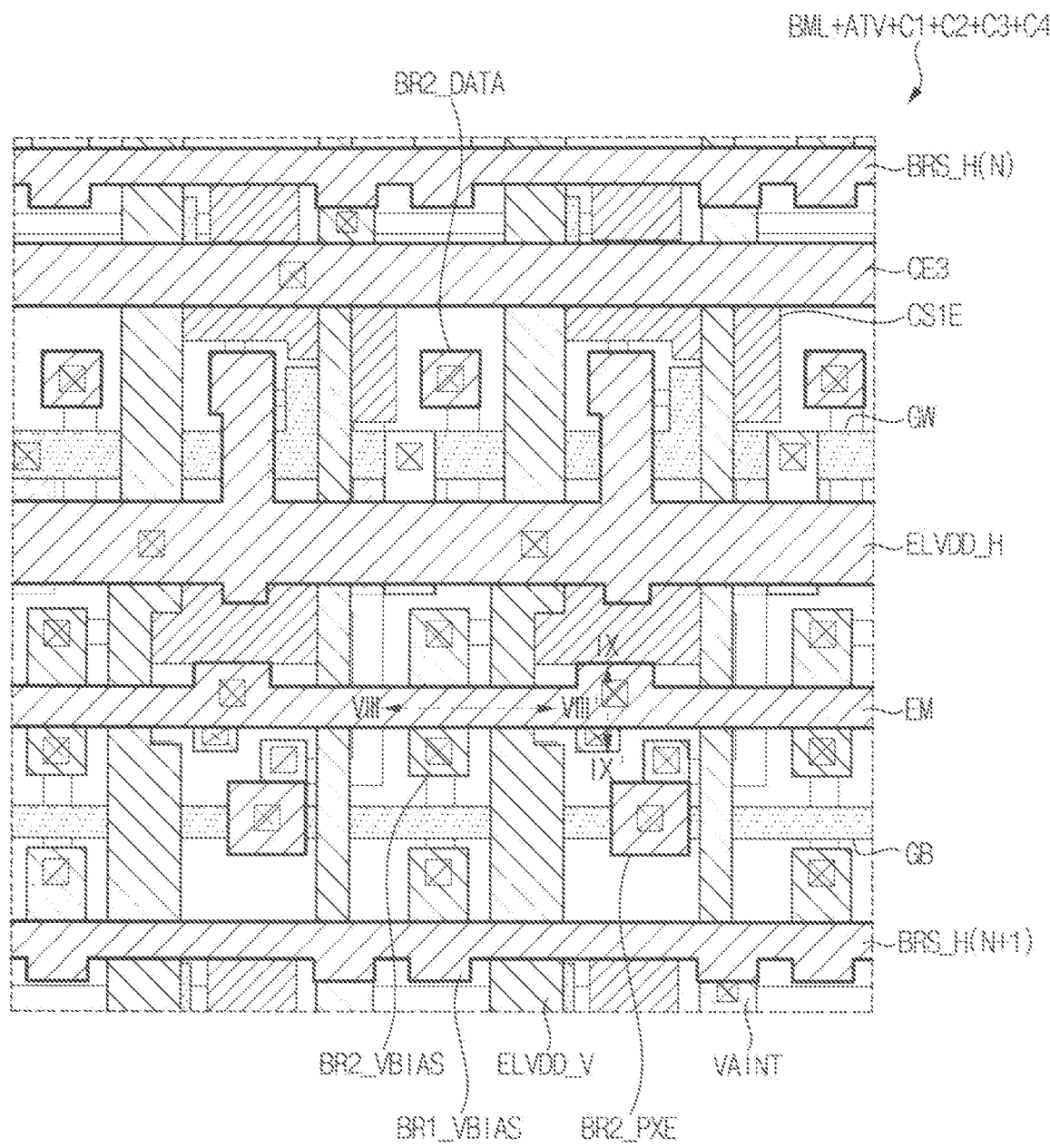

FIG. 17 is a plan view for explaining the bottom metal electrode BML, the semiconductor layer ATV, the first conductive layer C1, the second conductive layer C2, the third conductive layer C3, and the fourth conductive layer C4.

Referring to FIG. 17, the fourth conductive layer C4 may be located on the bottom metal electrode BML, the semiconductor layer ATV, the first conductive layer C1, the second conductive layer C2, and the third conductive layer C3.

The third connection electrode CE3 may electrically come into contact with the initialization voltage line VINT. According to some embodiments, the third connection electrode CE3 may additionally come into contact with an initialization voltage line included in an adjacent pixel circuit.

FIG. 17 shows embodiments in which the third connection electrode CE3 electrically comes into contact with the initialization voltage line VINT, however, on the contrary, the third connection electrode CE3 may electrically come into contact with the diode initialization voltage line VAINT instead of the initialization voltage line VINT. The third connection electrode CE3 may additionally come into contact with a diode initialization voltage line included in an adjacent pixel circuit.

The light emission control line EM may electrically come into contact with the second light emission control bridge electrode BR2_EM. This will be described later with reference to FIG. 18.

The first horizontal power voltage line ELVDD_H may electrically come into contact with the first vertical power supply voltage line ELVDD_V.

In addition, the first horizontal power voltage line ELVDD_H may overlap with the first connection electrode CE1 when viewed in a plan view. Accordingly, the first horizontal power voltage line ELVDD_H shields the first connection electrode CE1, so that stability of the pixel circuit PXCa may be improved.

The second data bridge electrode BR2_DATA may electrically come into contact with the first data bridge electrode BR1_DATA.

The second pixel bridge electrode BR2_PXE may electrically come into contact with the first pixel bridge electrode BR1_PXE.

Figure 18:
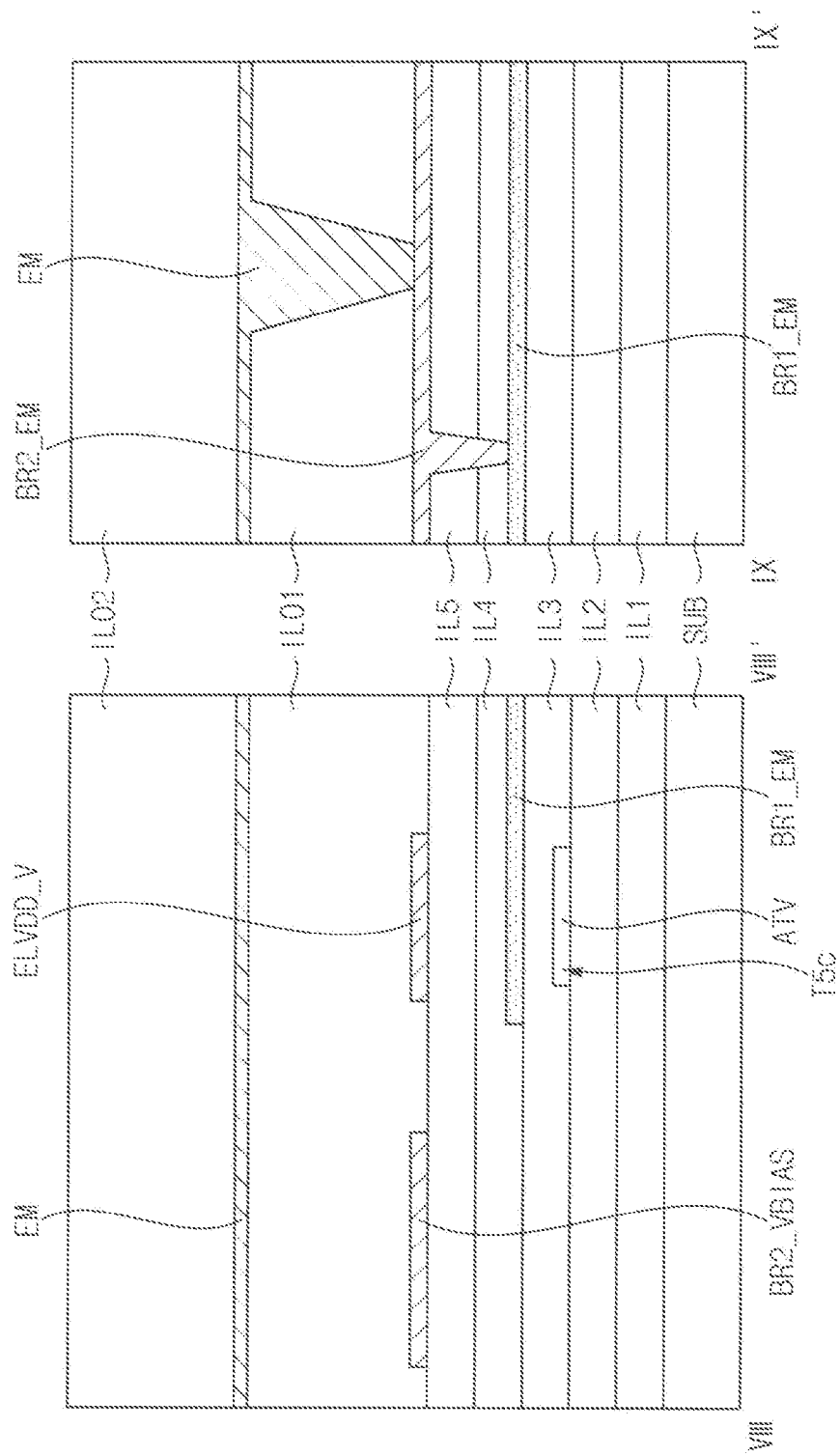

FIG. 18 is a sectional view taken along lines VIII-VIII' and IX-IX' of FIG. 17.

Referring to FIG. 18, the second organic insulating layer ILO2 may be located on the first organic insulating layer IL01, and may include an organic insulating material. For example, the second organic insulating layer ILO2 may include at least one of acrylic resin, methacrylic resin, polyisoprene, vinyl-based resin, epoxy-based resin, urethane-based resin, cellulose-based resin, siloxane-based resin, polyimide-based resin, polyimide-based resin, or perylene-based resin.

The fourth conductive layer C4 may be located on the first organic insulating layer IL01, and the second organic insulating layer ILO2 may cover the fourth conductive layer C4. For example, as shown in FIG. 18, the light emission control line EM may be located on the first organic insulating layer IL01, and the second organic insulating layer ILO2 may cover the light emission control line EM.

The light emission control line EM may electrically come into contact with the second light emission control bridge electrode BR2_EM, and the second light emission control bridge electrode BR2_EM may electrically come into contact with the first light emission control bridge electrode BR1_EM. Accordingly, the light emission control signal applied to the light emission control line EM may be provided to the first light emission control bridge electrode BR1_EM through the second light emission control bridge electrode BR2_EM.

Referring to FIGS. 12, 17 and 18, the first light emission control bridge electrode BR1_EM may be spaced apart from the second bias bridge electrode BR2_VBIAS when viewed in a plan view. In other words, the first light emission control bridge electrode BR1_EM may not overlap with the second bias bridge electrode BR2_VBIAS when viewed in the plan view.

Accordingly, signal interference may not substantially occur between the light emission control signal provided to the first light emission control bridge electrode BR1_EM and the signal passing through the second bias bridge electrode BR2_VBIAS (for example, the signal outputted from the output terminal of the bias transistor T8). In other words, during the period in which the light emission control signal provided to the first light emission control bridge electrode BR1_EM fluctuates, the signal passing through the second bias bridge electrode BR2_VBIAS may not substantially fluctuate.

Likewise, the second light emission control bridge electrode BR2_EM may be spaced apart from the second bias bridge electrode BR2_VBIAS when viewed in a plan view. Accordingly, signal interference may not substantially occur between the light emission control signal provided to the second light emission control bridge electrode BR2_EM and the signal passing through the second bias bridge electrode BR2_VBIAS.

Referring to FIGS. 17 and 18, according to some embodiments, the light emission control line EM may overlap with the second light emission control bridge electrode BR2_EM when viewed in the plan view. However, signal interference may not substantially occur between the light emission control signal applied to the light emission control line EM and the signal passing through the second bias bridge electrode BR2_VBIAS.

Specifically, the first organic insulating layer IL01 may be located between the light emission control line EM and the second light emission control bridge electrode BR2_EM, and the first organic insulating layer IL01 may have a relatively large thickness. For example, the thickness of the first organic insulating layer IL01 may be greater than the sum of the thickness of the third insulating layer IL3, the thickness of the fourth insulating layer IL4, and the thickness of the fifth insulating layer IL5.

The separation distance between the bottom surface of the light emission control line EM and the top surface of the second light emission control bridge electrode BR2_EM may be relatively large. Accordingly, signal interference may not substantially occur between the light emission control signal applied to the light emission control line EM and the signal passing through the second bias bridge electrode BR2_VBIAS.

On the contrary, a fourth inorganic insulating layer IL4 and a fifth inorganic insulating layer IL5 may be located between the first light emission control bridge electrode BR1_EM and the second bias bridge electrode BR2_VBIAS, and each of the fourth inorganic insulating layer IL4 and the fifth inorganic insulating layer IL5 may have a relatively small thickness. For example, the sum of the thickness of the fourth inorganic insulating layer IL4 and the thickness of the fifth inorganic insulating layer IL5 may be smaller than the thickness of the first organic insulating layer IL01.

The separation distance between the top surface of the first light emission control bridge electrode BR1_EM and the bottom surface of the second bias bridge electrode BR2_VBIAS may be smaller than the separation distance between the bottom surface of the light emission control line EM and the top surface of the second light emission control bridge electrode BR2_EM. Accordingly, when the first light emission control bridge electrode BR1_EM and the second bias bridge electrode BR2_VBIAS are arranged to overlap with each other in the plan view, signal interference may occur between the light emission control signal provided to the first light emission control bridge electrode BR1_EM and the signal passing through the second bias bridge electrode BR2_VBIAS.

FIGS. 17 and 18 shows embodiments in which the light emission control line EM overlaps with the second light emission control bridge electrode BR2_EM when viewed in the plan view, however, the present disclosure is not limited thereto. For example, the light emission control line EM may not overlap with the second light emission control bridge electrode BR2_EM when viewed in the plan view.

Figure 19:
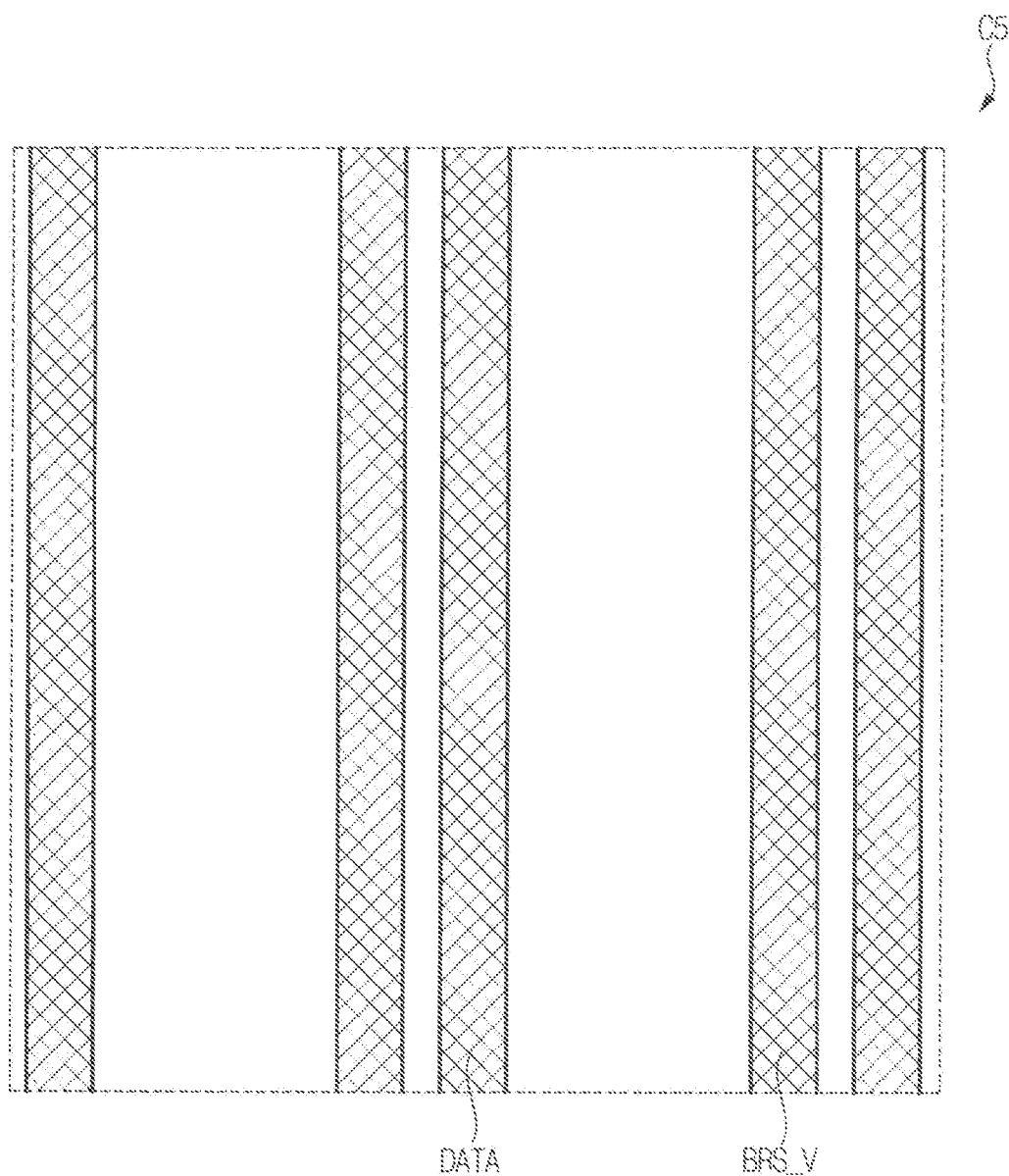

FIG. 19 is a plan view for explaining a fifth conductive layer C5.

Referring to FIG. 19, the pixel circuit PXa may include a fifth conductive layer C5. The fifth conductive layer C5 may include a conductive material. For example, the fifth conductive layer C5 may include silver, alloys containing silver, titanium, alloys containing titanium, molybdenum, alloys containing molybdenum, aluminum, alloys containing aluminum, aluminum nitride, tungsten, tungsten nitride, copper, indium tin oxide, indium zinc oxide, and the like, and these may be used individually or in combination. In addition, the fifth conductive layer C5 may have a single-layer or multi-layer structure including at least one of the above-described materials.

The fifth conductive layer C5 may include a data voltage line DATA and a vertical bridge line BRS_V. The data voltage may be applied to the data voltage line DATA.

Figure 20:
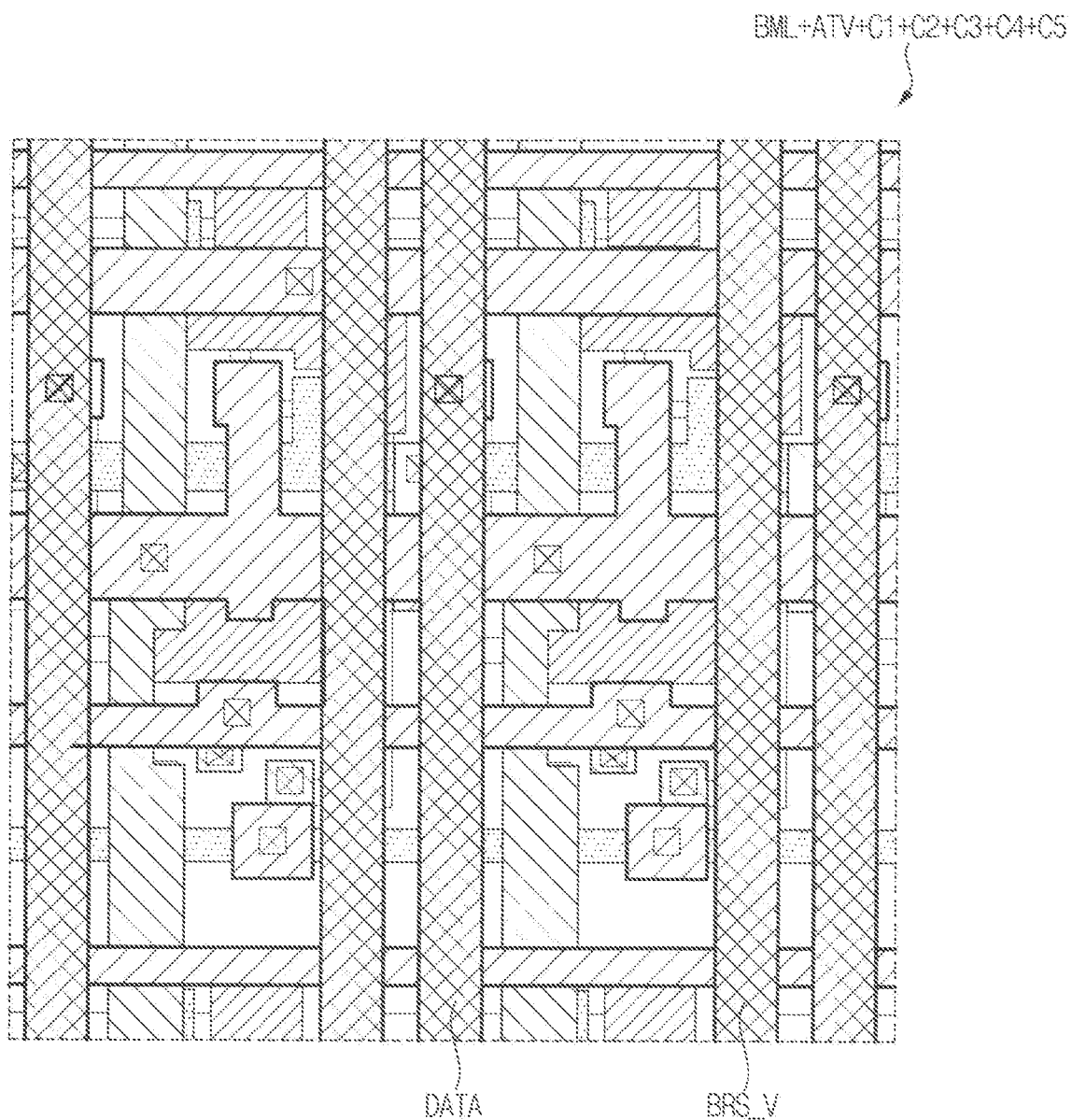

FIG. 20 is a plan view for explaining the bottom metal electrode BML, the semiconductor layer ATV, the first conductive layer C1, the second conductive layer C2, the third conductive layer C3, the fourth conductive layer C4, and the fifth conductive layer C5.

Referring to FIG. 20, the fifth conductive layer C5 may be located on the bottom metal electrode BML, the semiconductor layer ATV, the first conductive layer C1, the second conductive layer C2, the third conductive layer C3, and the fourth conductive layer C4.

The data voltage line DATA may electrically come into contact with the second data bridge electrode BR2_DATA. Accordingly, the data voltage applied to the data voltage line DATA may be provided to the input terminal of the switching transistor T2 through the second data bridge electrode BR2_DATA and the first data bridge electrode BR1_DATA.

According to some embodiments, the horizontal bridge line BRS_H may electrically come into contacts with the data voltage line DATA, or the vertical bridge line BRS_V may electrically come into contacts with the horizontal bridge line BRS_H. Accordingly, the data voltage applied to the data voltage line DATA may be transmitted to various paths through the vertical bridge line BRS_V and/or the horizontal bridge line BRS_H.

For example, the data voltage line DATA may electrically come into contact with the horizontal bridge line BRS_H, and the horizontal bridge line BRS_H may additionally come into contact with a data line included in a pixel circuit of an M-th row spaced apart from the pixel circuit PXCa in a row direction. Accordingly, the same data voltage may be applied to the data voltage line DATA and the data line included in the pixel circuit of the M-th row. Accordingly, the vertical bridge line BRS_V and the horizontal bridge line BRS_H may serve to provide various paths, so that the same data voltage may be applied to the data voltage line DATA included in the pixel circuit PXCa and data lines included in other pixel circuits spaced apart from the pixel circuit PXCa.

Figure 21:
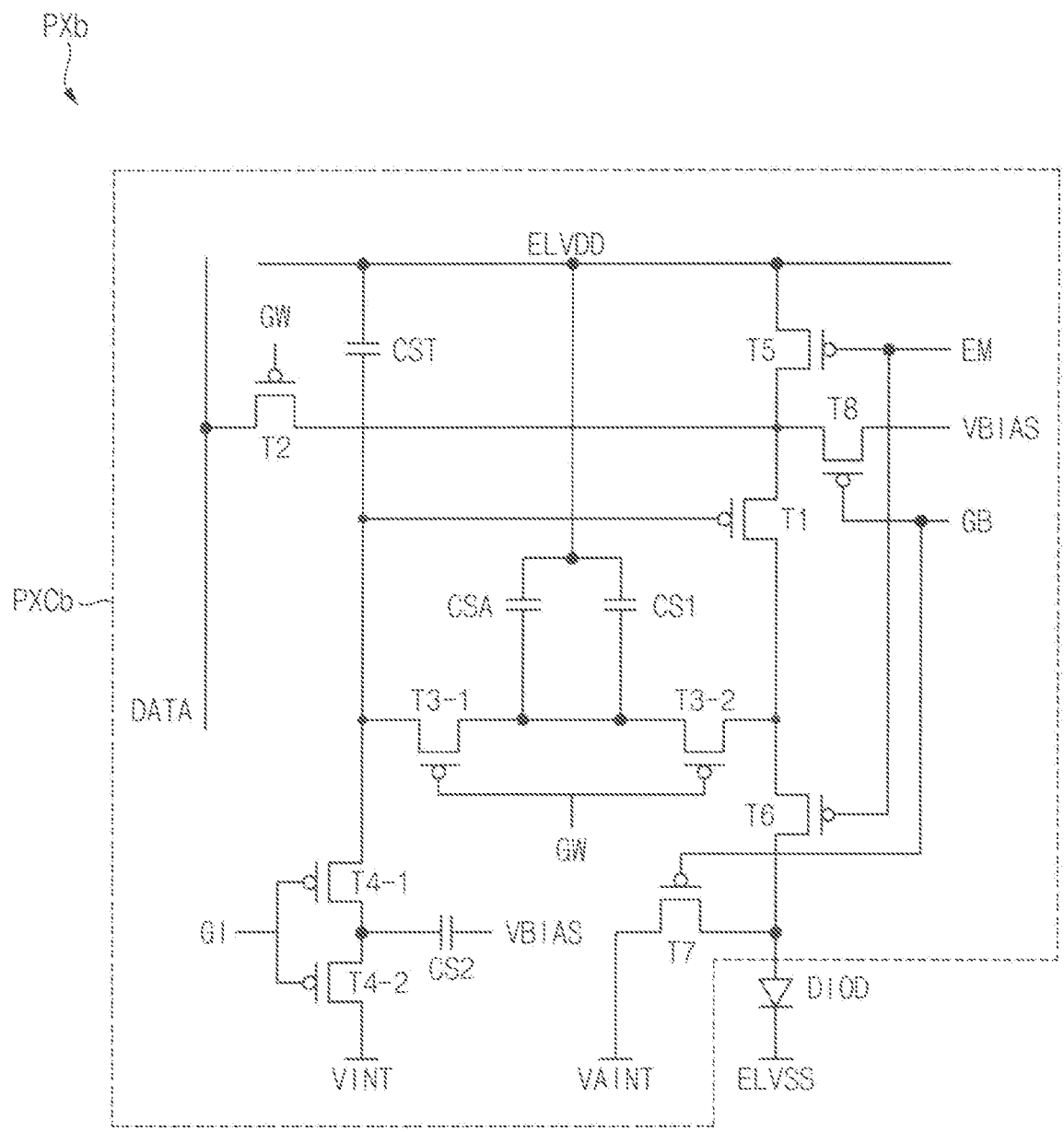
FIG. 21 is a circuit diagram for explaining a pixel included in a display device according to some embodiments of the present disclosure.

FIG. 21 is a circuit diagram for explaining a pixel included in a display device according to some embodiments of the present disclosure.

With reference to FIG. 21, the display device according to some embodiments of the present disclosure may include a pixel PXb. The pixel PXb may be defined in a minimum unit for emitting light, and may include a pixel circuit PXCb and a light emitting diode DIOD.

The light emitting diode DIOD may be substantially the same as the light emitting diode DIOD described with reference to FIG. 1. In addition, the pixel circuit PXCb may be substantially similar to the pixel circuit PXCa described with reference to FIG. 1. Specifically, the pixel circuit PXCb may be substantially the same as the pixel circuit PXCa described with reference to FIG. 1, except for the structure of the diode transistor T3. Accordingly, hereinafter, duplicate descriptions will be omitted.

Each of the first sub-transistor T3-1 and the second sub-transistor T3-2 may have only one gate electrode. In other words, each of the first sub-transistor T3-1 and the second sub-transistor T3-2 may not be a double-gate structure.

Figure 22:
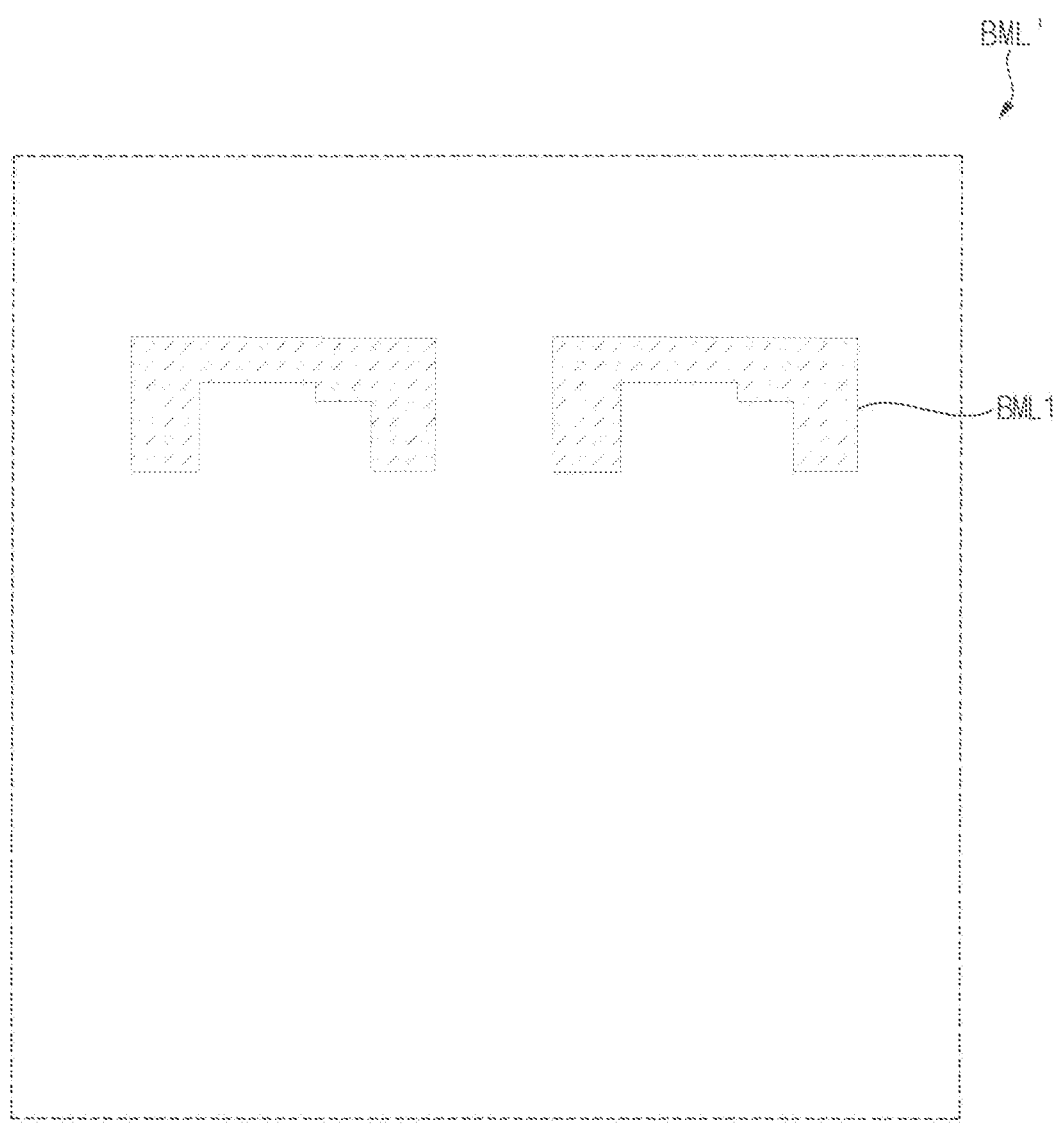
FIGS. 22 to 24 are views for explaining the pixel of FIG. 21 according to some embodiments of the present disclosure.
Figure 23:
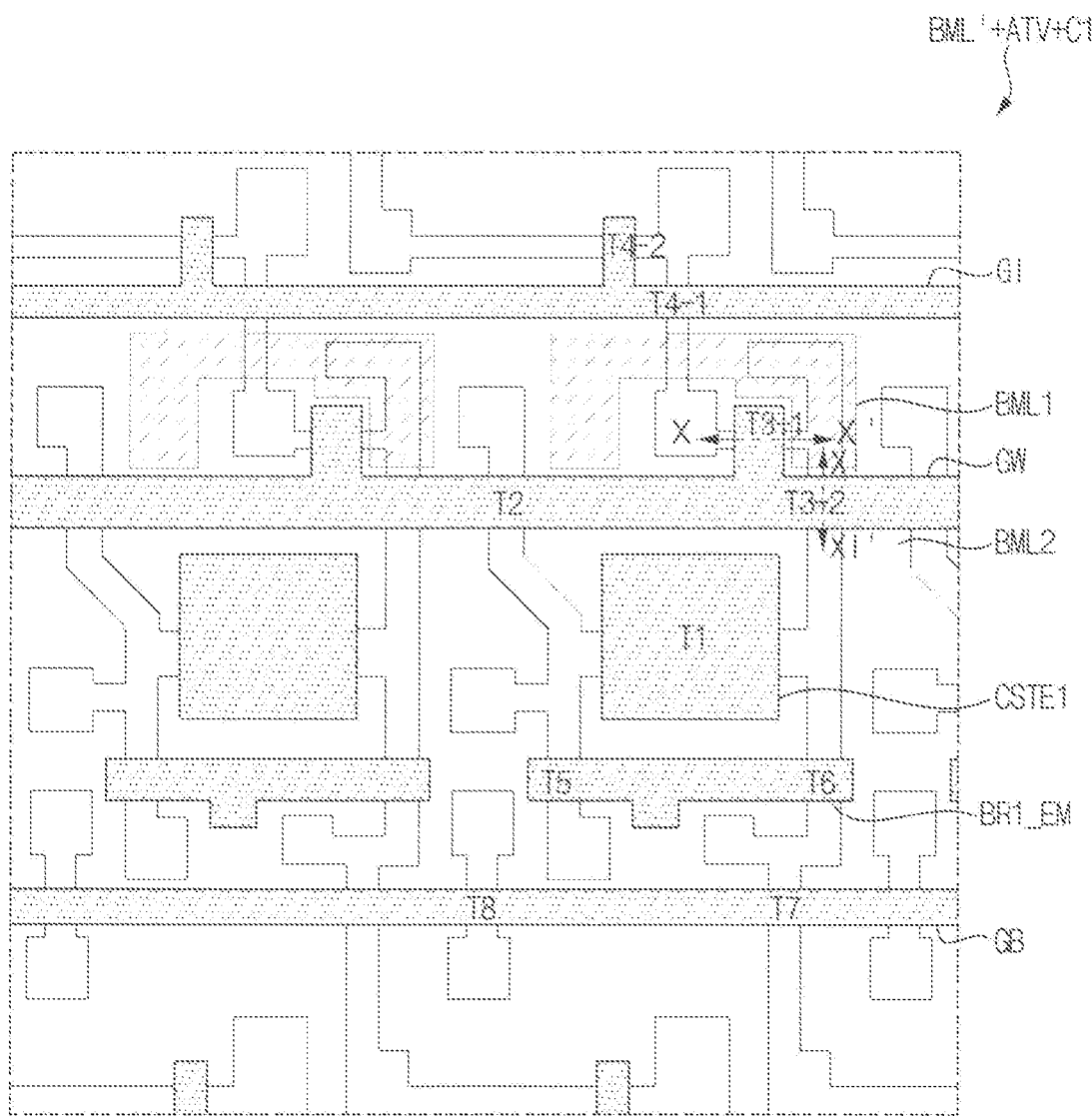
Figure 24:
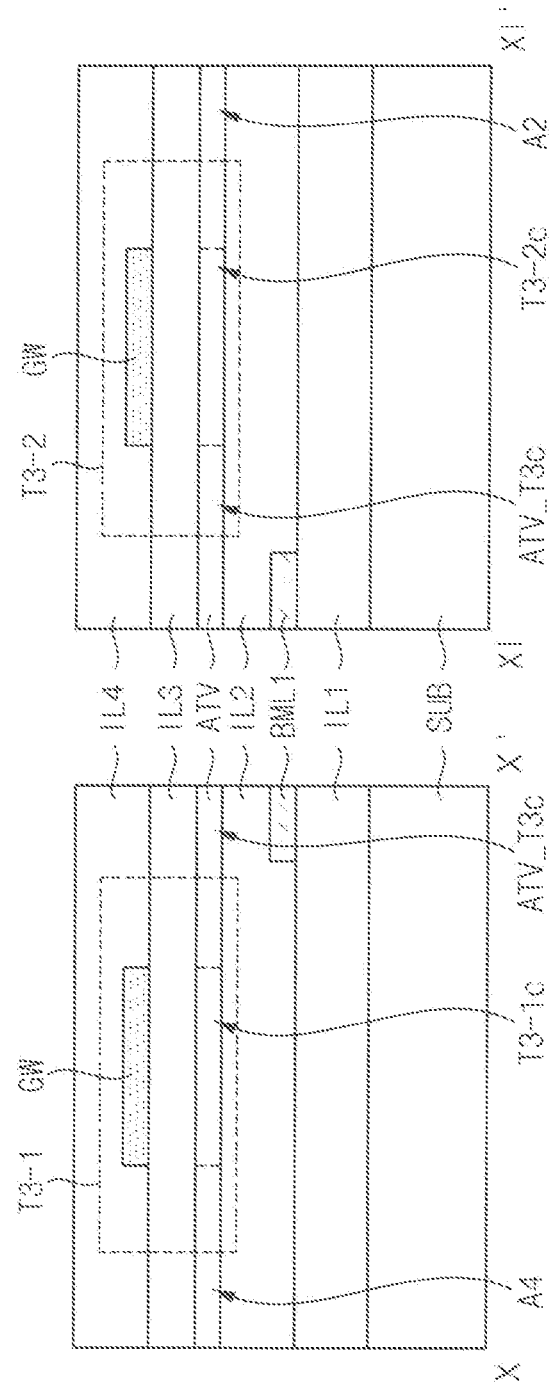

FIGS. 22 to 24 are views for explaining the pixel of FIG. 21. FIG. 22 is a plan view for explaining a bottom metal electrode BML'. FIG. 23 is a plan view for explaining the bottom metal electrode BML', the semiconductor layer ATV, and the first conductive layer C1. FIG. 24 is a sectional view taken along lines X-X' and XI-XI' of FIG. 23.

Referring to FIGS. 22 to 24, the pixel circuit PXCb may include a bottom metal electrode BML', a semiconductor layer ATV, and a first conductive layer C1. In addition, according to some embodiments, the pixel circuit PXCb may include a second conductive layer C2, a third conductive layer C3, a fourth conductive layer C4 and a fifth conductive layer C5. In other words, the pixel circuit PXCb may include substantially the same configurations as the pixel circuit PXCa described with reference to FIGS. 2 to 20, except for the bottom metal electrode BML'. Accordingly, duplicate descriptions will be omitted.

The bottom metal electrode BML' may include a first bottom metal electrode BML1. In other words, the bottom metal electrode BML' may have a structure in which the second bottom metal electrode BML2 is omitted from the bottom metal electrode BML described with reference to FIG. 2. Each of the first sub-transistor T3-1 and the second sub-transistor T3-2 included in the pixel circuit PXCb may be a single gate transistor including only the top gate electrode defined by the first gate voltage line GW.

In addition, in the third conductive layer C3 included in the pixel circuit PXCb, the second connection electrode CE2 for electrically connecting the second bottom metal electrode BML2 and the first gate voltage line GW to each other may be omitted.

Figure 25:
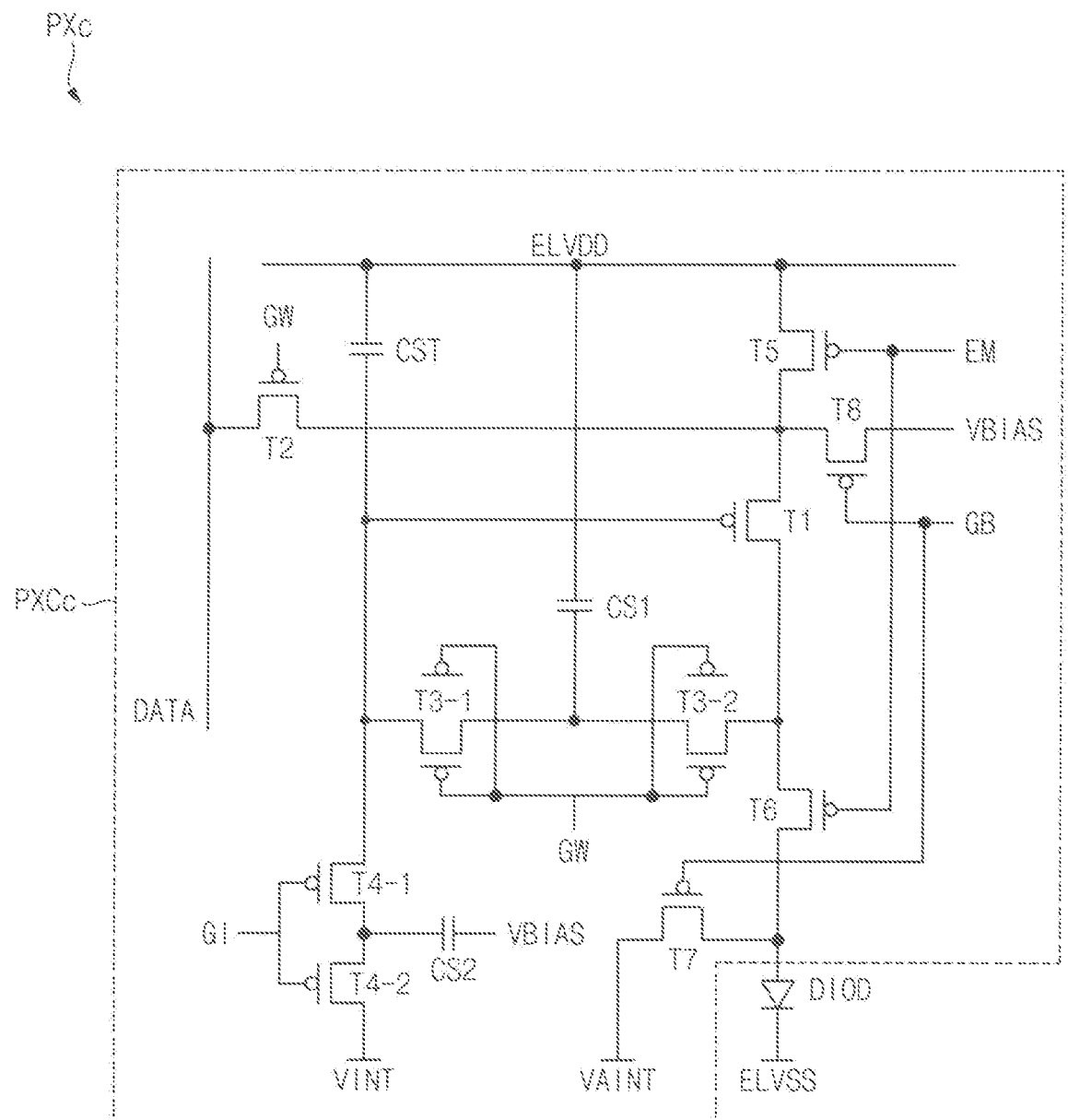
FIG. 25 is a circuit diagram for explaining a pixel included in a display device according to some embodiments of the present disclosure.

FIG. 25 is a circuit diagram for explaining a pixel included in a display device according to some embodiments of the present disclosure.

Referring to FIG. 25, the display device according to some embodiments of the present disclosure may include a pixel PXc. The pixel PXc may be defined in a minimum unit for emitting light, and may include a pixel circuit PXCc and a light emitting diode DIOD.

The light emitting diode DIOD may be substantially the same as the light emitting diode DIOD described with reference to FIG. 1. In addition, the pixel circuit PXCc may be substantially similar to the pixel circuit PXCa described with reference to FIG. 1. Specifically, the pixel circuit PXCc may be substantially the same as the pixel circuit PXCa described with reference to FIG. 1, except that the additional-stabilization capacitor CSA is omitted. Accordingly, hereinafter, duplicate descriptions will be omitted.

Figure 26:
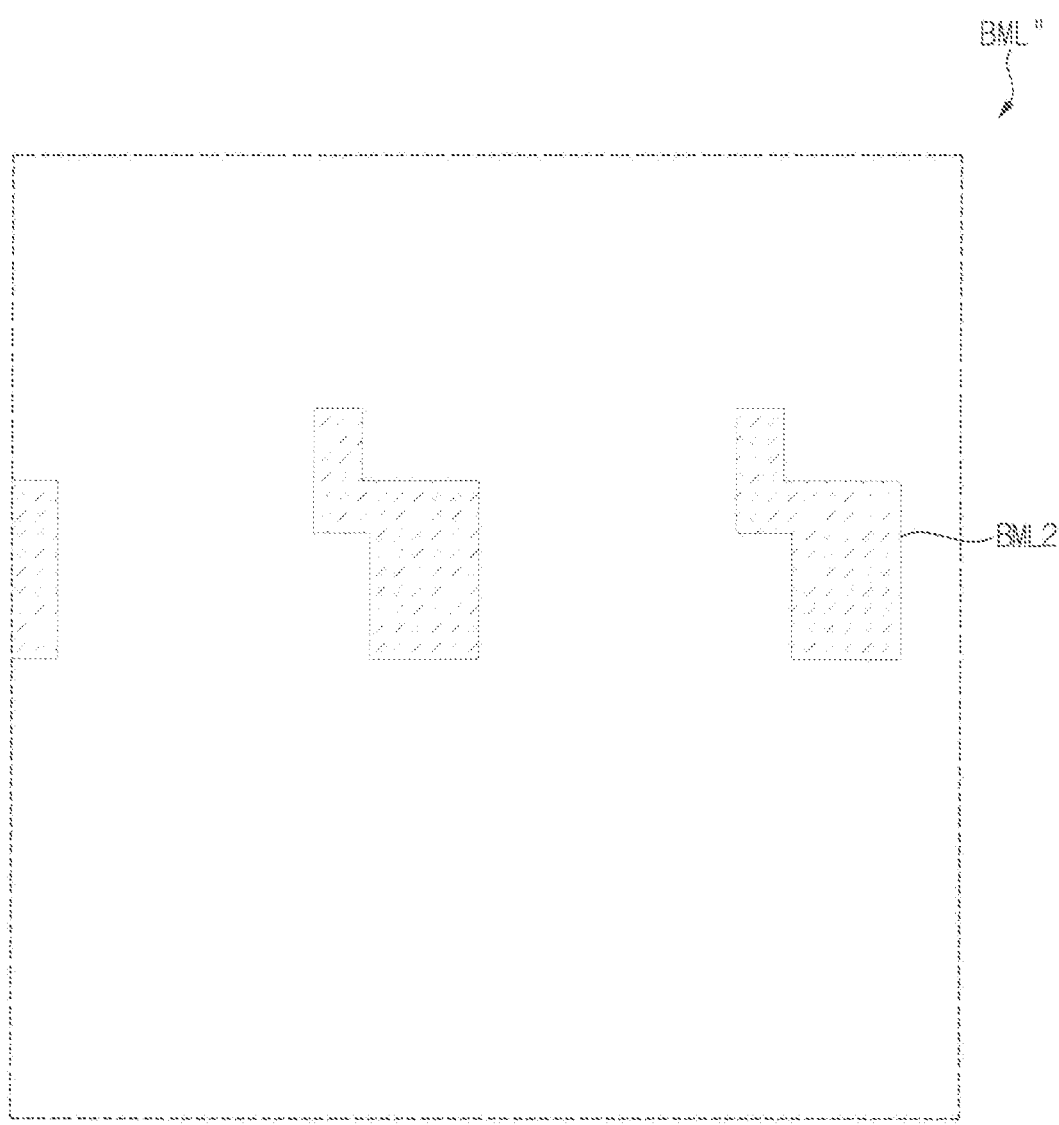
FIGS. 26 to 28 are views for explaining the pixel of FIG. 25 according to some embodiments of the present disclosure.
Figure 27:
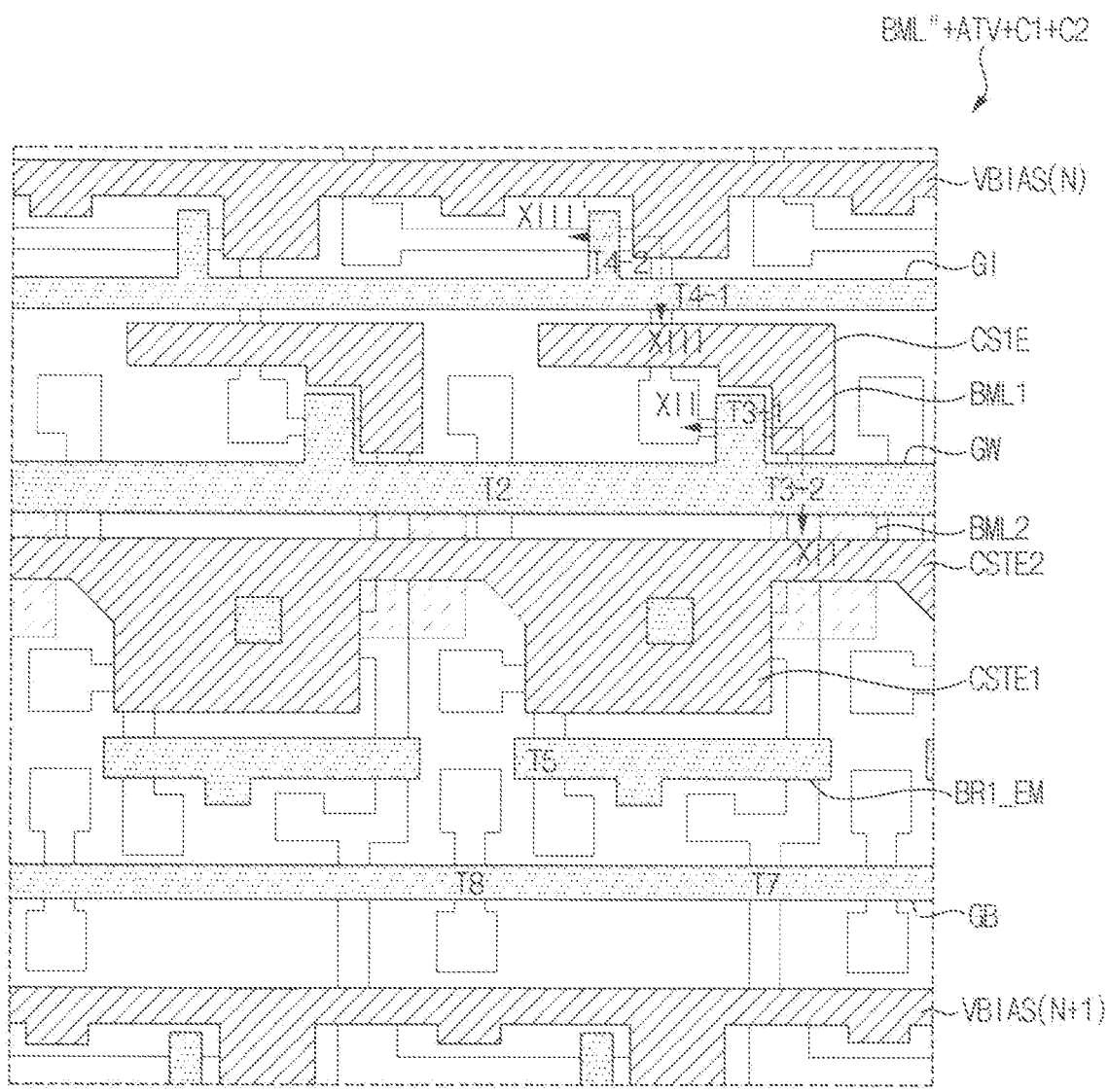
Figure 28:
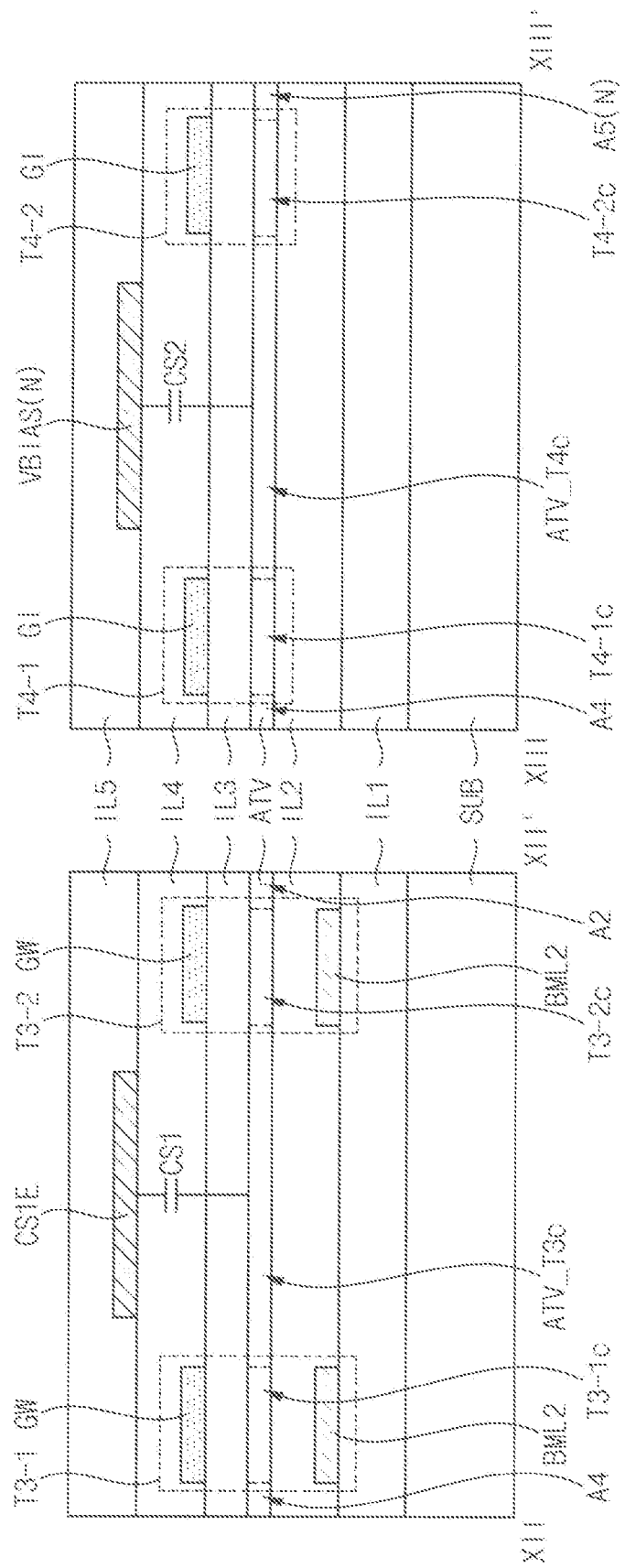

FIGS. 26 to 28 are views for explaining the pixel of FIG. 25. FIG. 26 is a plan view for explaining a bottom metal electrode BML". FIG. 27 is a plan view for explaining the bottom metal electrode BML', the semiconductor layer ATV, and the first conductive layer C1. FIG. 28 is a sectional view taken along lines XII-XII' and XIII-XIII' of FIG. 27.

Referring to FIGS. 26 to 28, the pixel circuit PXCc may include a bottom metal electrode BML", a semiconductor layer ATV, and a first conductive layer C1. In addition, according to some embodiments, the pixel circuit PXCc may include a second conductive layer C2, a third conductive layer C3, a fourth conductive layer C4 and a fifth conductive layer C5. In other words, the pixel circuit PXCc may include substantially the same configurations as the pixel circuit PXCa described with reference to FIGS. 2 to 20, except for the bottom metal electrode BML". Accordingly, duplicate descriptions will be omitted.

The bottom metal electrode BML" may include a second bottom metal electrode BML2. In other words, the bottom metal electrode BML" may have a structure in which the first bottom metal electrode BML1 is omitted from the bottom metal electrode BML" described with reference to FIG. 2. The pixel circuit PXCc may not include the additional-stabilization capacitor CSA.

In addition, in the third conductive layer C3 included in the pixel circuit PXCc, the first vertical power voltage line ELVDD_V may electrically come into contact with each of the second storage electrode CSTE2 and the first stabilization electrode CS1E.

Although the methods have been described with reference to the embodiments of the present disclosure, it will be apparent to a person having ordinary skill in the art that various modifications and variations can be made in the present disclosure without departing from the scope and field of the following appended claims, and their equivalents.

The display device according to the embodiments of the present disclosure may be applied to various electronic apparatuses. For example, the display device according to the embodiments of the present disclosure may be applied to display devices included in computers, smartphones, smart pads, tablet PCs, and the like.

What is claimed is:
1. A display device comprising:
a light emitting diode;
a driving transistor configured to transmit driving current to the light emitting diode;
a bias transistor including an input terminal electrically connected to a bias voltage line;
a first light emission control transistor including an output terminal electrically connected to an input terminal of the driving transistor, and a gate electrode configured to receive a light emission control signal;
a second light emission control transistor including an input terminal electrically connected to an output terminal of the driving transistor, and a gate electrode configured to receive the light emission control signal;
a bias bridge electrode electrically in contact with each of an output terminal of the bias transistor and the input terminal of the driving transistor;
a first light emission control bridge electrode configured to receive the light emission control signal, defining the gate electrode of the first light emission control transistor and the gate electrode of the second light emission control transistor, and spaced apart from the bias bridge electrode when viewed in a plan view throughout a pixel circuit.

2. The display device of claim 1, further comprising:
a second light emission control bridge electrode on the first light emission control bridge electrode in a sectional view, and electrically in contact with the first light emission control bridge electrode; and
a light emission control line on the second light emission control bridge electrode when viewed in the sectional view, electrically in contact with the second light emission control bridge electrode, and applied thereto with the light emission control signal.

3. The display device of claim 2, further comprising:
at least one inorganic insulating layer between the second light emission control bridge electrode and the first light emission control bridge electrode in the sectional view.

4. The display device of claim 2, further comprising:
at least one organic insulating layer between the light emission control line and the second light emission control bridge electrode in the sectional view.

5. The display device of claim 2, wherein a distance between a bottom surface of the light emission control line and a top surface of the second light emission control bridge electrode in the sectional view is greater than a distance between a bottom surface of the second light emission control bridge electrode and a top surface of the first light emission control bridge electrode in the sectional view.

6. The display device of claim 2, wherein the second light emission control bridge electrode is spaced apart from the bias bridge electrode in the plan view.

7. The display device of claim 2, wherein the second light emission control bridge electrode is on a same layer as the bias bridge electrode.

8. The display device of claim 1, further comprising:
a first sub-transistor having an output terminal connected to the gate electrode of the driving transistor; and
a diode transistor including a second sub-transistor having an output terminal connected to an input terminal of the first sub-transistor and an input terminal connected to the output terminal of the driving transistor.

9. The display device of claim 8, further comprising:
a first stabilization electrode overlapping with a first common area of a semiconductor layer defining each of the input terminal of the first sub-transistor and the output terminal of the second sub-transistor, thereby defining a first stabilization capacitor.

10. The display device of claim 9, further comprising:
a first bottom metal electrode overlapping with the first common area of the semiconductor layer defining each of the input terminal of the first sub-transistor and the output terminal of the second sub-transistor, thereby defining an additional-stabilization capacitor.

11. The display device of claim 10, wherein the first stabilization electrode is above the first common area of the semiconductor layer in a sectional view, and the first bottom metal electrode is below the first common area of the semiconductor layer in the sectional view.

12. The display device of claim 10, wherein the first stabilization electrode and the first bottom metal electrode are electrically connected to each other, and a same signal is applied to the first stabilization electrode and the first bottom metal electrode.

13. The display device of claim 12, wherein the signal applied to the first stabilization electrode and the first bottom metal electrode includes a constant voltage signal.

14. The display device of claim 8, wherein each of the first sub-transistor and the second sub-transistor includes a double-gate transistor including a top gate electrode and a bottom gate electrode.

15. The display device of claim 14, further comprising:
a first gate voltage line defining a top gate electrode of the first sub-transistor and a top gate electrode of the second sub-transistor; and
a second bottom metal electrode defining a bottom gate electrode of the first sub-transistor and a bottom gate electrode of the second sub-transistor.

16. The display device of claim 15, wherein the first gate voltage line and the second bottom metal electrode are electrically connected to each other, and the second bottom metal electrode is configured to receive a first gate voltage from the first gate voltage line.

17. The display device the of claim 1, further comprising:
a driving initialization transistor including a third sub-transistor having an output terminal connected to the gate electrode of the driving transistor, and a fourth sub-transistor having an output terminal connected to an input terminal of the third sub-transistor and an input terminal connected to an initialization voltage line.

18. The display device of claim 17, wherein the bias voltage line overlaps with a second common area of a semiconductor layer defining each of the input terminal of the third sub-transistor and the output terminal of the fourth sub-transistor, thereby defining a second stabilization capacitor.

19. A display device comprising:
a light emitting diode;
a driving transistor configured to transmit a driving current to the light emitting diode;
a bias transistor including an input terminal electrically connected to a bias voltage line;
a first light emission control transistor including an output terminal electrically connected to an input terminal of the driving transistor and a gate electrode configured to receive a light emission control signal;
a second light emission control transistor including an input terminal electrically connected to an output terminal of the driving transistor and a gate electrode configured to receive the light emission control signal;
a diode transistor including a first sub-transistor having an output terminal connected to a gate electrode of the driving transistor, and a second sub-transistor having an output terminal connected to an input terminal of the first sub-transistor and an input terminal connected to the output terminal of the driving transistor; and
a first bottom metal electrode overlapping with a first common area of a semiconductor layer defining each of the input terminal of the first sub-transistor and the output terminal of the second sub-transistor, thereby defining an additional-stabilization capacitor.

20. The display device of claim 19, further comprising:
a first stabilization electrode overlapping with the first common area of the semiconductor layer defining each of the input terminal of the first sub-transistor and the output terminal of the second sub-transistor, thereby defining a first stabilization capacitor.

21. The display device of claim 19, wherein each of the first sub-transistor and the second sub-transistor includes a double-gate transistor including a top gate electrode and a bottom gate electrode.

22. The display device of claim 21, further comprising:
a first gate voltage line defining a top gate electrode of the first sub-transistor and a bottom gate electrode of the second sub-transistor; and
a second bottom metal electrode defining a bottom gate electrode of the first sub-transistor and a bottom gate electrode of the second sub-transistor, and electrically connected to the first gate voltage line.

23. The display device of claim 22, wherein the first bottom metal electrode and the second bottom metal electrode are on a same layer.

24. The display device of claim 22, wherein each of the first bottom metal electrode and the second bottom metal electrode is below the semiconductor layer in a sectional view, and the first bottom metal electrode and the second bottom metal electrode are spaced apart from each other in a plan view.

25. A display device comprising:
a light emitting diode;
a driving transistor configured to transmit a driving current to the light emitting diode;
a bias transistor including an input terminal electrically connected to a bias voltage line;
a first light emission control transistor including an output terminal electrically connected to an input terminal of the driving transistor and a gate electrode configured to receive a light emission control signal;
a second light emission control transistor including an input terminal electrically connected to an output terminal of the driving transistor and a gate electrode configured to receive the light emission control signal;
a diode transistor including a first sub-transistor having an output terminal connected to a gate electrode of the driving transistor, and a second sub-transistor having an output terminal connected to an input terminal of the first sub-transistor and an input terminal connected to the output terminal of the driving transistor;
a first gate voltage line defining a top gate electrode of the first sub-transistor and a top gate electrode of the second sub-transistor; and
a second bottom metal electrode defining a bottom gate electrode of the first sub-transistor and a bottom gate electrode of the second sub-transistor.

* * * * *